United States Patent
Okamoto et al.

(10) Patent No.: US 7,830,147 B2
(45) Date of Patent: Nov. 9, 2010

(54) RF COIL ASSEMBLY FOR MRI USING DIFFERENTLY SHAPED AND/OR SIZED COILS

(75) Inventors: Kazuya Okamoto, Saitama (JP); Shinji Mitsui, Nasushiobara (JP); Manabu Ishii, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 1 day.

(21) Appl. No.: 12/073,304

(22) Filed: Mar. 4, 2008

(65) Prior Publication Data

US 2008/0157772 A1 Jul. 3, 2008

Related U.S. Application Data

(63) Continuation of application No. 11/274,478, filed on Nov. 16, 2005, now Pat. No. 7,394,253.

(30) Foreign Application Priority Data

Nov. 16, 2004 (JP) .......................... P2004-331914
Jun. 14, 2005 (JP) .......................... P2005-173920

(51) Int. Cl.
*G01V 3/00* (2006.01)
(52) U.S. Cl. ...................................................... 324/318
(58) Field of Classification Search .................. 324/309
See application file for complete search history.

(56) References Cited

U.S. PATENT DOCUMENTS

| 4,721,913 A | 1/1988 | Hyde et al. |
| 5,198,768 A | 3/1993 | Keren |
| 5,389,880 A * | 2/1995 | Mori .......................... 324/318 |
| 6,300,761 B1 | 10/2001 | Hagen et al. |
| 6,591,128 B1 * | 7/2003 | Wu et al. ...................... 600/422 |
| 6,624,633 B1 | 9/2003 | Zou et al. |
| 6,639,406 B1 | 10/2003 | Boskamp et al. |
| 6,727,701 B1 * | 4/2004 | Jevtic et al. .................. 324/318 |
| 6,750,653 B1 | 6/2004 | Zou et al. |

(Continued)

FOREIGN PATENT DOCUMENTS

JP 2003-334177 11/2003

(Continued)

OTHER PUBLICATIONS

Office Action dated Sep. 21, 2007 in the Chinese Patent Application No. 2005101216771.

(Continued)

*Primary Examiner*—Brij B Shrivastav
*Assistant Examiner*—Dixomara Vargas
(74) *Attorney, Agent, or Firm*—Nixon & Vanderhye PC

(57) ABSTRACT

A radio frequency coil assembly is provided. The radio frequency coil assembly includes: a first radio frequency coil for receiving a magnetic resonance signal from a tested body; a second radio frequency coil for receiving a magnetic resonance signal from the tested body; and a third radio frequency coil for receiving a magnetic resonance signal from the tested body and having a shape which is different from that of at least one of the first and second radio frequency coils so as to increase a local sensitivity in an image-picked-up region.

2 Claims, 20 Drawing Sheets

U.S. PATENT DOCUMENTS

| | | |
|---|---|---|
| 6,975,115 B1 | 12/2005 | Fujita et al. |
| 7,221,161 B2 | 5/2007 | Fujita et al. |
| 7,394,253 B2 * | 7/2008 | Okamoto et al. ............ 324/318 |
| 2003/0094948 A1 | 5/2003 | Okamoto et al. |
| 2003/0132750 A1 | 7/2003 | Machida et al. |
| 2004/0135579 A1 | 7/2004 | Takizawa et al. |
| 2004/0196042 A1 | 10/2004 | Fujita et al. |

OTHER PUBLICATIONS

Examination Report dated Apr. 20, 2010 in JP 2004-331914.

* cited by examiner (A-A') RADIO FREQUENCY MAGNETIC FIELD B1 GENERATED BY CROSS COIL

BODY AXIS DIRECTION

BODY AXIS DIRECTION

RF COIL ASSEMBLY FOR MRI USING DIFFERENTLY SHAPED AND/OR SIZED COILS

CROSS REFERENCE TO RELATED APPLICATION

This application is a continuation of U.S. patent application Ser. No. 11/274,478 filed Nov. 16, 2005 now U.S. Pat. No. 7,394,253 and which claimed priority from JP Application 331914/2004 filed Nov. 16, 2004 and JP Application 173920/2005 filed Jun. 14, 2005, the disclosure of which priority applications is incorporated herein by reference.

BACKGROUND OF THE INVENTION

1. Field of the Invention

The present invention relates to a radio frequency coil assembly for collecting a magnetic resonance signal from a tested person based on a magnetic resonance phenomenon and a magnetic resonance imaging (MRI) apparatus having the radio frequency coil assembly.

2. Description of the Related Art

Magnetic resonance imaging (MRI) performed by an MRI apparatus is an image pickup method of magnetically exciting nuclear spins of a tested person under a static magnetic field with a radio frequency signal having a Larmor frequency to generate a magnetic resonance (MR) signal and reconstructing an image from the generated MR signal.

In order to implement the image pickup method, the MRI apparatus includes a static magnetic field magnet for generating a static magnetic field and a mechanism for applying a gradient magnetic field pulse and a radio frequency magnetic field pulse to the tested person according to a predetermined pulse sequence. The gradient magnetic field pulse is transmitted to the tested person through a gradient magnetic coil which is disposed in a bore of the static magnetic field magnet and connected to a gradient magnetic field power source. Similarly, the radio frequency magnetic field pulse is transmitted to the tested person through a transmission radio frequency coil which is disposed in the bore of the static magnetic field magnet and connected to a transmitter. In order to receive a magnetic resonance signal including a radio frequency signal generated from the tested person, a reception radio frequency coil is disposed in the vicinity of the tested person. Although a single coil may be used as the transmission and reception radio frequency coils, in many cases, dedicated reception radio frequency coils are used according to diagnosis positions.

For example, in order to obtain an image with a high sensitivity, a plurality of surface coils (an array coil) as a reception radio frequency coil are disposed in a diagnosis region of the tested person, and an image thereof is picked up. For example, as a backbone coil, an array coil where QD surface coils are arranged in a body axis direction is disclosed in JPA H5-261081. The array coil is shown in FIG. 30.

Now, a QD surface coil will be described. As shown in FIG. 31, a QD coil 120 is a coil constructed by overlapping a loop-shaped surface coil 121 and an 8-shaped surface coil 122. Since a total sum of radio frequency magnetic fields generated in a loop is zero, the coils can be disposed to overlap with each other in a magnetically decoupled state. When the radio frequency magnetic fields B1 generated from two coils 121 and 122 in a cross section taken in line A-A' are seen, the radio frequency magnetic fields B1 are perpendicular to each other in the axis as shown in FIG. 32. In this case, since noises from the coils 121 and 122 are independent of each other, in a state that the signals are shifted by 90° from each other, if the signals are added to each other, SNR is as follows.

$$SNR \propto (|B1(\text{loop-shaped})|+|B1(\text{8-shaped})|)/\sqrt{2}$$

FIG. 33 shows characteristics of SNRs in the axes of the coils 121 and 122. A long dotted line shows an SNR profile of the loop-shaped surface coil 121, and a short dotted line shows a profile of the 8-shaped surface coil 122. A solid line shows an SNR profile of the QD surface coil 120 obtained by perform 90°-shifting and addition processes. It can be seen that the SNR of the QD surface coil 120 is $2^{1/2}$ times higher than that of a position where the SNRs of the loop-shaped surface coil 121 and the 8-shaped surface coil 122 are equal to each other. In addition, it can be seen that the SNR of the QD surface coil 120 is higher than those of the two coils 121 and 122 in a wide range. Like this, a high SNR can be obtained by using the QD surface coil 120 in comparison to a case where the loop-shaped surface coil or the 8-shaped surface coil is individually used.

On the other hand, as a case where an image of the entire abdomen is picked up, a method of receiving a signal from the entire abdomen by using a plurality of surface coils which are disposed to surround the tested person is disclosed in JPA 2003-334177. As shown in FIG. 34, in many cases, an array coil constructed by arranging a plurality of loop coils corresponding to a body surface is used as the surface coils.

Like this, by disposing a plurality of the surface coils corresponding to the imaged portions, it is possible to obtain an image for the imaged portions with the highest sensitivities thereof. However, since there is a need to allocate coils corresponding to the imaged portions, the number of coils increases, and the coils need to be changed according to the imaged portions when the tested persons are changed. Accordingly, a large number of coils must be prepared, and the task of changing the coils is burdensome to medical technicians or doctors.

Like this, in the conventional reception radio frequency coil, since different dedicated array structures according to the imaged portions are used, the operators (medical technicians or doctors) must change the array coils when the imaged portion is changed. The changing task is burdensome to the operator, and much time is taken for the operator to perform the task. Therefore, preparation burden to the operator increases, and the task is one of the major factors of deterioration in patient throughput.

Recently, a technique of increasing the SNR of the QD surface coil by disposing a plurality of loop coils so as to be decoupled from each other and overlapping 8-shaped coils which intersect a central loop coil in an 8-shaped manner has been developed. An array coil is constructed by arranging a plurality of the coil sets in a direction perpendicular to an array direction of the loop coil, and the array coil is disposed on a top board, so that an image of the backbone of the tested person is picked up.

Although there is a difference between individual tested persons, when a tested person lies on the top board, in many cases, the backbone may be in a position relatively far (deep) from the top board, that is, the array coil. For example, the position may be 10 cm far from the top board. In this case, if the 8-shaped coil is disposed to overlap with only the aforementioned central loop coil, the sensitivity of collection of the signal from the relatively deep backbone is insufficient, and the SNR thereof is too low.

On the other hand, in the backbone coil shown in FIG. 35, four QD surface coils QD1, QD2, QD3, and QD4 are arranged in the body axis direction. In the technique, although the magnetic resonance signals emitting from many portions of the long backbone in the body axis direction are received by a plurality of corresponding surface coils so as to increase a range of the image-picked-up region, the sensitivity of a localized imaging process is not greatly improved.

In addition, a technique of alternately disposing coil units having four equivalent surface coils arranged in a direction intersecting the body axis direction may be used. By doing so, the signals emitted from localized portions of the backbone can be received by the four surface coils, so that it is possible to improve the sensitivity of the localized imaging process.

However, since the four equivalent surface coils are arranged in the direction intersecting the body axis direction, the outer surface coil is too far from the backbone, so that it is difficult for the outer surface coil to obtain a sufficient sensitivity. In other words, if the four surface coils are provided, there is a problem in that the corresponding sensitivity of the imaging process may not be sufficiently improved.

SUMMARY OF THE INVENTION

The present invention provides a radio frequency coil assembly capable of reducing a burden of changing reception radio frequency coils even in a case where images of different portions (typically, backbone and abdomen) of a tested person P are picked up and capable of collecting magnetic resonance signals from a plurality of portions with optimal sensitivities. The present invention also provides a magnetic resonance imaging apparatus having the radio frequency coil assembly.

According to an aspect of the invention, there is provided a radio frequency coil assembly comprising: a first radio frequency coil for receiving a magnetic resonance signal from a tested body; a second radio frequency coil for receiving a magnetic resonance signal from the tested body; and a third radio frequency coil for receiving a magnetic resonance signal from the tested body and having a shape which is different from that of at least one of the first and second radio frequency coils so as to increase a local sensitivity in an image-picked-up region.

According to another aspect of the invention, there is provided a radio frequency coil assembly for receiving a radio frequency magnetic resonance signal generated in a tested person based on a gradient magnetic field pulse and a radio frequency magnetic field pulse applied to the tested person under a static magnetic field according to a predetermined sequence, the radio frequency coil assembly comprising: a plurality of first radio frequency coils which are arranged to be adjacent to each other in a first direction; and a second radio frequency coil which is structurally decoupled from the first radio frequency coils.

According to another aspect of the invention, there is provided a radio frequency coil assembly having upper and lower coil assemblies disposed to face each other with a tested person interposed therebetween under a static magnetic field and allowing the upper and lower coil assemblies to receive a radio frequency magnetic resonance signal generated in the tested person based on a gradient magnetic field pulse and a radio frequency magnetic field pulse applied to the tested person according to a predetermined sequence, wherein the lower coil assembly at least comprises: a plurality of first radio frequency coils which are arranged to be adjacent to each other in a first direction; and a second radio frequency coil which is structurally decoupled from the first radio frequency coils.

According to another aspect of the invention, there is provided a radio frequency coil assembly having upper and lower coil assemblies disposed to face each other with a tested person interposed therebetween under a static magnetic field and allowing the upper and lower coil assemblies to receive a radio frequency magnetic resonance signal generated in the tested person based on a gradient magnetic field pulse and a radio frequency magnetic field pulse applied to the tested person according to a predetermined sequence, wherein the upper coil assembly at least comprises: a plurality of first radio frequency coils which are arranged to be adjacent to each other in a first direction; and a second radio frequency coil which is structurally decoupled from the first radio frequency coils.

According to another aspect of the invention, there is provided a magnetic resonance imaging apparatus having the radio frequency coil assembly according to the aforementioned aspects of the invention.

According to another aspect of the invention, there is provided a radio frequency coil assembly receiving a radio frequency magnetic resonance signal generated in a tested person based on a gradient magnetic field pulse and a radio frequency magnetic field pulse applied to the tested person under a static magnetic field, the radio frequency coil assembly comprising: a plurality of loop coils which are arranged to be adjacent to each other in a predetermined direction; and a cross coil which is disposed to overlap with at least one of the loop coils and shaped to cross at crossing times which are equal to or more than the number of loop coils.

According to another aspect of the invention, there is provided a radio frequency coil assembly receiving a radio frequency magnetic resonance signal generated in a tested person based on a gradient magnetic field pulse and a radio frequency magnetic field pulse applied to the tested person under a static magnetic field, the radio frequency coil assembly comprising: a plurality of loop coils which are arranged to be adjacent to each other in a predetermined direction; and a cross coil which is disposed to overlap with at least one of the loop coils and shaped to cross three times or more.

According to another aspect of the invention, there is provided a radio frequency coil assembly comprising: two inner loop coils; and two outer loop coils which are arranged to interpose the two inner loop coils, wherein each of the two inner loop coils has a width with respect to an array direction of at least four loop coils including the two inner loop coils and the two outer loop coils and an area of a loop plane which are smaller than those of the two outer loop coils.

According to another aspect of the invention, there is provided a radio frequency coil assembly comprising: at least four loop coils including two inner loop coils and two outer loop coils which are arranged to interpose the two inner loop coils; a first combining unit for performing an in-phase combining process on output signals of the two inner loop coils; a second combining unit for performing an out-of-phase combining process on output signals of the two outer loop coils; and a unit for performing a 90-degree-phase shifting process on one of the output signals of the first and second combining unit and a combining process.

According to another aspect of the invention, there is provided a radio frequency coil assembly comprising: two inner loop coils; and two outer loop coils which are arranged to interpose the two inner loop coils, wherein each of the two inner loop coils has a width with respect to an array direction of at least four loop coils including the two inner loop coils and the two outer loop coils which is smaller than that of the two outer loop coils.

According to another aspect of the invention, there is provided a radio frequency coil assembly comprising: a first loop coil; and a second loop coil which is disposed to be adjacent to the first loop coil, wherein the one of the first and second loop coils has a width with respect to an array direction of the first and second loop coils and an area of a loop plane which are smaller than those of the other.

According to another aspect of the invention, there is provided a magnetic resonance imaging apparatus having the radio frequency coil assembly according to the aforementioned aspects of the invention.

Like this, in the radio frequency coil assembly and the magnetic resonance imaging apparatus having the radio frequency coil assembly according to the invention, it is possible to reduce a burden to operators (medical technicians or doctors) and improve patient throughput.

BRIEF DESCRIPTION OF THE DRAWINGS

The present invention will be described with reference to the accompanying drawings, wherein like numbers reference like elements, and wherein.

DESCRIPTION OF THE PREFERRED EMBODIMENTS

Now, embodiments of a radio frequency coil assembly and an MRI (Magnetic Resonance Imaging) apparatus having the radio frequency coil assembly according the present invention will be described with reference to the accompanying drawings.

First Embodiment

Now, an MRI apparatus according to a first embodiment of the invention will be described with reference to FIGS. 1 to 9 will be described.

Figure 1:
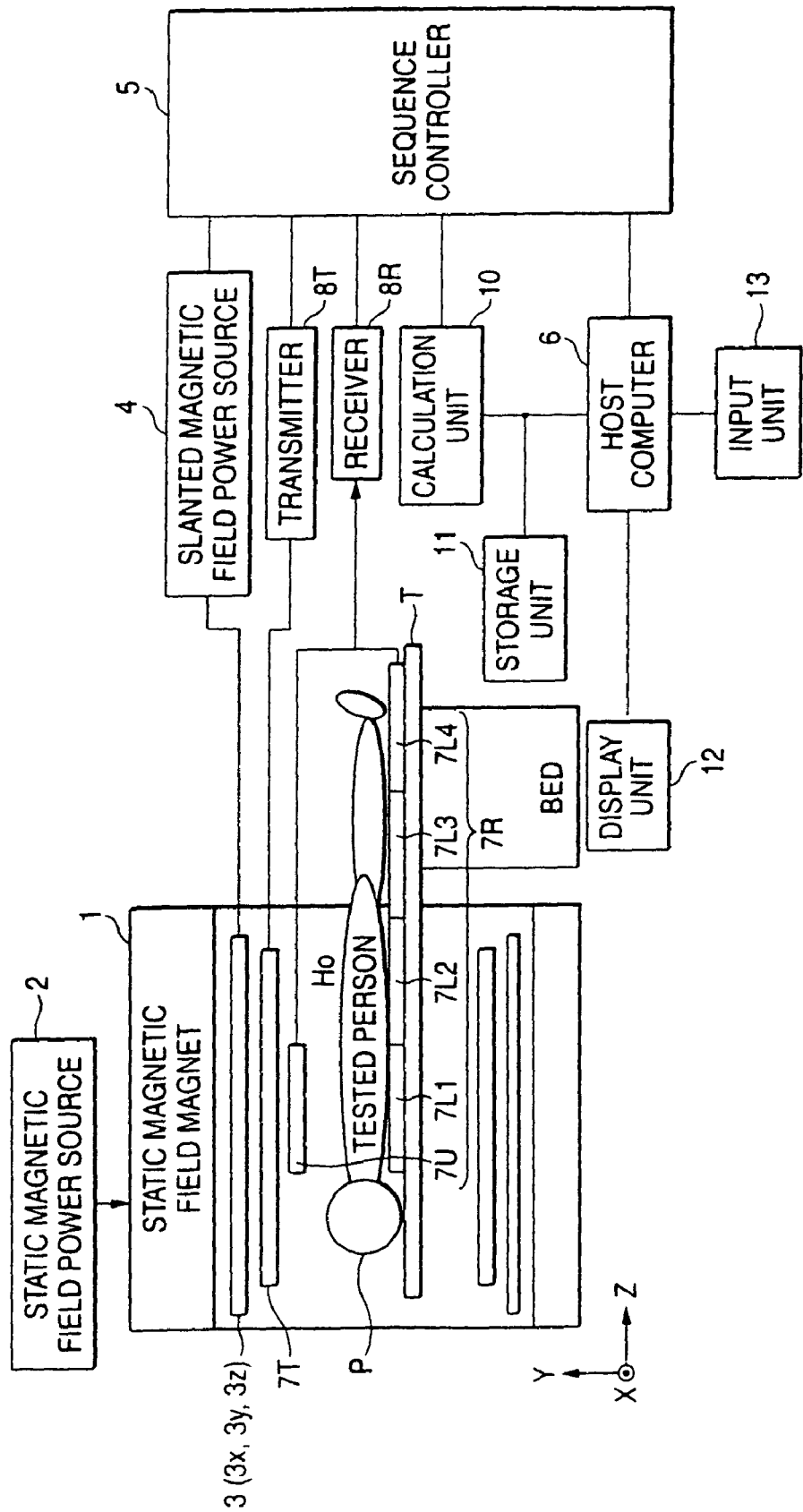
FIG. 1 is a schematic block diagram showing a construction of an MRI apparatus according to a first embodiment of the invention.

FIG. 1 shows a schematic construction of the MRI apparatus according to the first embodiment.

The MRI apparatus includes a bed portion on which a tested person P is loaded, a static magnetic field generating unit for generating a static magnetic field, a gradient magnetic field generating unit for adding positional information to the static magnetic field, a reception/transmission unit for receiving and transmitting a radio frequency signal, and a control calculation unit for controlling a whole system and reconstructing an image.

The static magnetic field generating unit includes a magnet 1 which is for example a superconductor type magnet, a static magnetic field power source 2 for supplying a current to the magnet 1 and generates a static magnetic field $H_o$ in an axial direction (Z-axis direction) of an cylindrical opening portion (a diagnosis space) into which the tested person is inserted. In addition, a shim coil (not shown) is provided to the magnet. In the bed portion, a top board on which the tested person P is loaded can be inserted into the opening portion of the magnet 1 in a retrogressive manner.

The gradient magnetic field generating unit includes a gradient magnetic field coil unit 3 which is embedded in the magnet 1. The gradient magnetic field coil unit 3 includes three sets of x, y, z coils 3x to 3z for generating X-axis, Y-axis, and Z-axis gradient magnetic fields which are perpendicular to each other. The gradient magnetic field generating unit includes a slanted magnetic field power source 4 for supplying a current to the x, y, z coils 3x to 3z. The gradient magnetic field power source 4 supplies a pulse current for generating the gradient magnetic field to the x, y, z coils 3x to 3z under the control of a later-described sequencer 5.

By controlling the pulse current supplied from the gradient magnetic field power source 4 to the x, y, z coils 3x to 3z, the three physical axis (X-, Y-, and Z-axis) gradient magnetic fields are combined, so that logical axes of a slice-direction slanted magnetic field $G_s$, a phase-encode-direction gradient magnetic field $G_E$, and a read-out-direction (frequency encode direction) gradient magnetic field $G_R$ which are perpendicular to each other can be arbitrarily set and modified. The slice-direction, phase-encode-direction, and read-out-direction gradient magnetic fields overlap with the static magnetic field $H_0$.

The reception/transmission unit includes transmission and reception radio frequency coils 7T and 7R which are disposed near the tested person P within an imaging space of the magnet 1 and a transmitter 8T and a receiver 8R which are connected to the radio frequency coil 7T and 7R. The transmitter 8T and the receiver 8R operate under the control of the later-described sequencer 5. By the operation thereof, the transmitter 8T supplies an RF current pulse having a Larmor frequency to the transmission radio frequency coil 7T in order to excite a nuclear magnetic resonance (NMR). The receiver 8R acquires a magnetic resonance (MR) signal (a radio frequency signal) received by the reception radio frequency coil 7R and performs various signal processes such as pre-amplification, intermediate frequency (IF) modulation, phase detection, low frequency amplification, and filtering on the MR signal. After that, the receivers perform A/D conversion on the MR signal to generate digital data (original data) for the MR signal.

The control calculation unit includes a sequencer (sometimes, referred as a sequence controller) 5, a host computer 6, a calculation unit 10, a storage unit 11, a display unit 12, and an input unit 13. The host computer 6 has functions of providing pulse sequence information to the sequencer 5 according to a pre-stored software procedure (not shown) and controlling whole operations of the apparatus.

The sequencer 5 includes a CPU and a memory. The sequencer 5 stores pulse sequence information transmitted from the host computer 6. According to the information, the sequencer 5 controls the operations of the slanted magnetic field power source 4, the transmitter 8T, and the receiver 8R to input digital data of the magnetic resonance signal output from the receiver 8R and transmit the digital data to the calculation unit 10. Here, the pulse sequence information is all the information required to operate the slanted magnetic field power source 4, the transmitter 8T, and the receiver 8R according to a series of pulse sequences. For example, the pulse sequence information includes information such as an intensity, an applying time, and an applying timing of a pulse applied to the x, y, and z coils 3x to 3z.

In addition, the calculation unit 10 receives the digital data (sometimes, referred to as original data or raw data) output from the receiver 8R as an input, disposes the digital data in a k-space (sometimes, referred to as a Fourier space or a frequency space) in the inner memory, and performs a two-dimensional or three-dimensional Fourier transformation on every set of the data to reconstruct image data in a real space. In addition, the calculation unit 10 also performs a combining process or a differentiation calculation process on data associated to the image, as needed. The combining process includes an addition process, a maximum intensity projection (MIP) process, or the like, for each pixel.

In addition to the reconstructed image data, the storage unit 11 may stores the image date which are subject to the aforementioned combining process or the differentiation operation process. The display unit 12 is used to display, for example, the reconstructed image. In addition, through the input unit 13, operators may input desired parameter information, scan conditions, pulse sequences, information of image combining or differentiating calculations, or the like to the host computer 6.

Now, the reception radio frequency coil 7R among the aforementioned construction will be described in detail.

In the first embodiment, the reception radio frequency coil 7R can be used to receive the magnetic resonance signal from both of the backbone and the abdomen of the tested person P, and the reception radio frequency coil 7R is constructed with surface coils capable of collecting signals for the backbone and the abdomen with an optimal sensitivity.

More specifically, as schematically shown in FIG. 1, the reception radio frequency coil 7R includes the upper radio frequency coil assembly 7U, and the lower radio frequency coil assemblies 7L (7L1, 7L2, 7L3, and 7L4) which are disposed to obtain image data for desired regions of the tested person P. As described later, each of the coil assemblies 7U and 7L are constructed with a plurality of element coils, and the magnetic resonance signals received from the element coils are transmitted to the receiver 8R.

The receiver 8R include reception channels, of which number corresponds to the number of coils of the upper and lower radio frequency coil assemblies 7U and 7L, and the reception channels are supplied with the magnetic resonance signal from the surface coils. Therefore, the digital data corresponding to the magnetic resonance signals are output from the reception channels.

The data collected from the reception channel are transmitted to the calculation unit 10 through the sequence 5. The calculation unit 10 reconstructs the received collected data to generate time-axis image data. In the reconstruction, the data collected from the coils of the reception radio frequency coil 7R are independently reconstructed, for example, for the reception channels and subject to a rood mean square process so as to be combined into a single image.

Here, the lower radio frequency coil assembly 7L is disposed to the back (a lower portion of the image-picked-up region) of the tested person P who lies on his/her back to face the scan, and in a case where the backbone of the tested person P is scanned, only the lower radio frequency coil assembly 7L is used. The lower radio frequency coil assembly 7L is always disposed on the top board T. On the other hand, in a case where an image of the abdomen as a portion of the body of the tested person P is picked up, the upper radio frequency coil assembly 7U is disposed to the body surface of the tested person P, and the scan of the abdomen is performed by using the upper radio frequency coil assembly 7U, some of the lower radio frequency coil assemblies 7L (7L1 to 7L4), for example, the coil assembly 7L1. Namely, in the first embodiment, some of the lower radio frequency coil assemblies 7L, for example, the coil assembly 7L1, are used to scan a plurality of the body portions (for example, cervical vertebrae and abdomen).

In the first embodiment, each of the upper radio frequency coil assembly 7U and the lower radio frequency coil assemblies 7L1 to 7L4 is constructed with a plurality of element coils. A set of the element coil is referred as a coil assembly.

Figure 2:
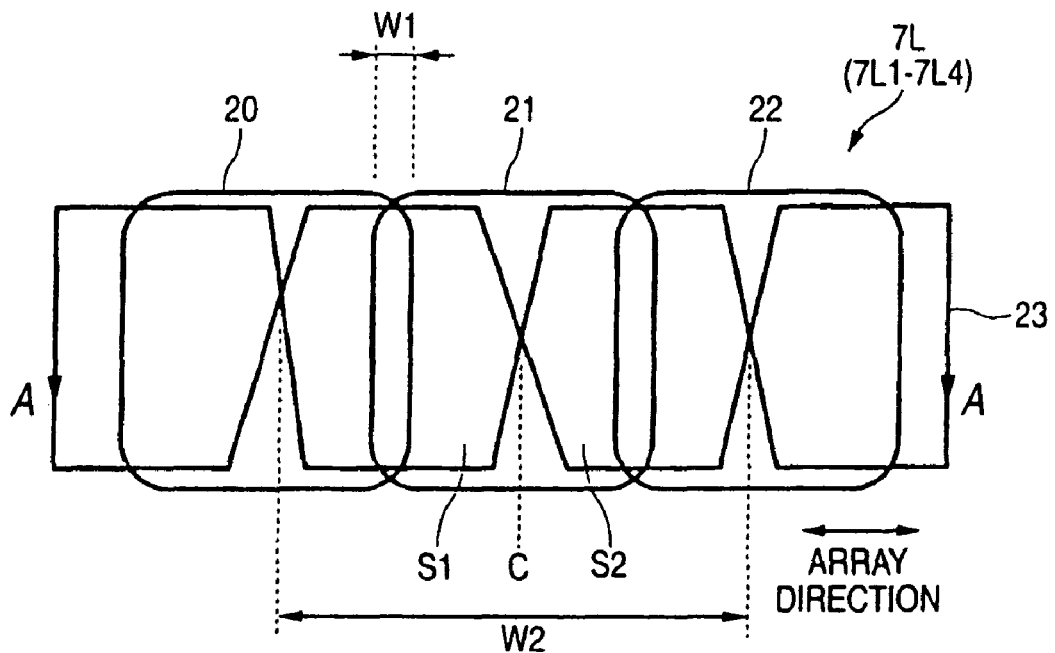
FIG. 2 is a schematic view showing an arrangement of a coil assembly constituting a surface coil according to the first embodiment.

FIG. 2 shows an example of the coil assembly. Each of the coil assemblies includes three loop coils (first element coils) 20, 21, and 22 which are disposed in an arrayed shape and a cross coil (a second element coil) 23 which is disposed to overlap with the loop coils 20, 21, and 22 and be in a separate structure. The coil elements are made of, for example, FPC (flexible printed circuit), and supported by a plastic support member having a predetermined shape.

The signals detected by the coils 20, 21, 22, and 23 are transmitted to coaxial cables through synchronization/match circuits of the coils and independently connected to the receiver 8R through the coaxial cables.

In order to suppress electrically-coupling between the adjacent loop coils, the loop coils 20, 21, and 22 are disposed so that the adjacent loop coils overlap with each other by a suitable width (see, W1 of FIG. 2) in a predetermined direction so as to allow a total sum of radio frequency magnetic fields generated therefrom to be zero in the loop.

In addition, with respect to the cross coil 23, two consecutive 8-shaped element coils are formed by crossing a single coil conductor three times. Namely, three coil-line intersection portions in a predetermined direction are formed to obtain four coil planes. In addition, in a state that the array directions of a group of the loop coils and the cross coil are formed to be coincident with each other and the central positions C in these directions are matched with each other, two central coil planes S1 and S2 of the four coil planes formed by the cross coil 23 overlap with the loop coils 20, 21, and 22. Here, the two central coil planes S1 and S2 are formed to extend over the central loop coil 21 to overlap with the adjacent loop coils 20 and 22. Namely, the overlapping range W2 where the two central coil planes of the cross coil 23 and the loop coils 20, 21, and 22 overlap with each other is designed to be larger than that of the central loop coil 21. More specifically, the overlapping range W2 is not limited to the central loop coil 21, but it overlaps with the adjacent loop coils 20 and 22, so that the three loop coils 20, 21, and 22 can cover substantially the same image-picked-up region.

Here, if the number of the loop coils 20, 21, and 22 is N, the crossing times of the cross coil 23 formed by crossing the single coil conductor into a plurality of the 8-shaped portions is at least N.

Figure 3:
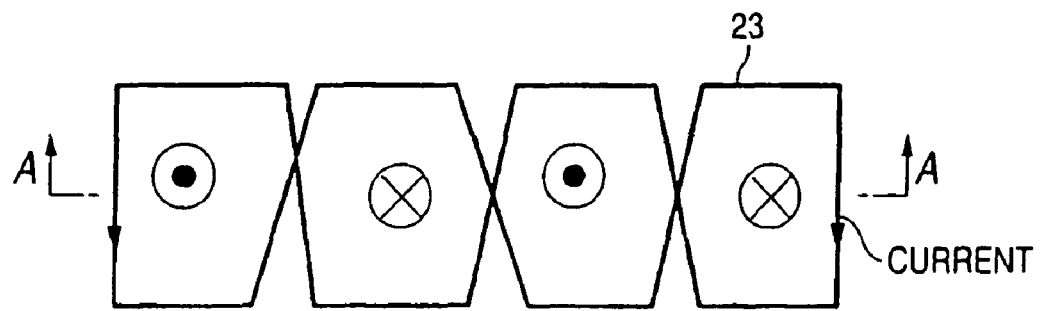
FIG. 3 is a schematic view showing an arrangement of cross coils embedded in the coil assembly according to the first embodiment.
Figure 4:
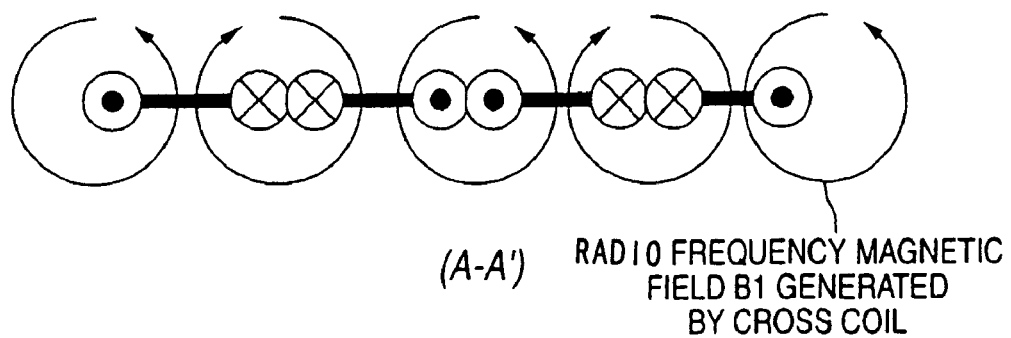
FIG. 4 is a view for explaining a direction of a magnetic flux generated by the cross coil shown in FIG. 3.

FIGS. 3 and 4 are views showing details of the radio frequency magnetic field generated from the cross coils 23. As shown in FIG. 3, in a case where a current flow through the cross coil 23 in a direction indicated by arrows, the magnetic field B1 shown in FIG. 4 is generated. Similarly to the first embodiment, in case of the cross coil 23 having a wide overlap region W2 with respect to the three loop coils 20, 21, and 22 (namely, having substantially the same image-picked-up regions for the three loop coils 20, 21, and 22), in order to generate substantially perpendicular magnetic field in axial directions of the adjacent loop coils 20 and 22 as well as the central loop coil 21 in the array direction, the SNRs in the axes of the loop coils 20, 21, and 22 can be improved by performing a combining process with the signal from the cross coil 23.

In addition, the cross coil 23 is formed to have two consecutive 8-shaped coils. Therefore, by adjusting the crossing shape of the cross coils 23, the flux generated by the cross coil 23 can be designed so that an amount of the flux linked to the loop coils 20, 21, and 22 can be zero. Namely, the magnetically-decoupling of the cross coil 23 from the loop coils 20, 21, and 22 can be implemented.

As described above, the cross coils 23 generate the radio frequency magnetic field substantially perpendicular to the central axes of the three loop coils 20, 21, and 22, so that a QD (quadrature) effect can be obtained. Therefore, similarly to the QD surface coil, by combining the data detected from the loop coils 20, 21, and 22 and the cross coil 23, it is possible to increase SNR (SN ratio) in the central axes of the loop coils 20, 21, and 22. A state of the increase in the SNR is more enhanced (heightened) than the SNR obtained from a structure where the cross coil 23 is designed to cross the central central loop coil 21. The coil assembly constructed with the loop coils 20, 21, and 22 and the cross coil 23 can be suitably used to scan the backbone of the tested person P. Namely, the reason is that, in a case where the tested person P lies on his/her back, the backbone is located at a so farther (deeper) distance that the coil (there is a personal difference), and thus, a higher SNR is needed.

Figure 5:
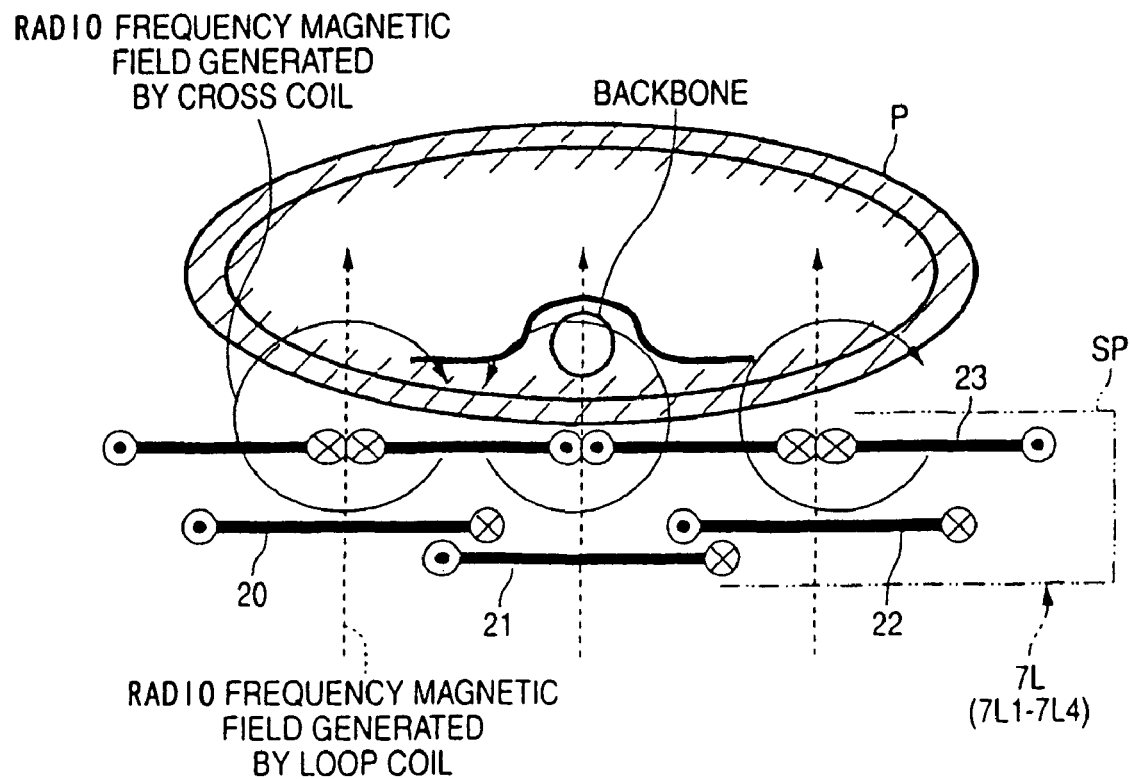
FIG. 5 is a view for explaining an example of an arrangement of the coil assembly and a direction of the generated magnetic flux in a case where the coil assembly according to the first embodiment is used for picking up an image of a back of a human body with a backbone centered.

The lower radio frequency coil assemblies 7L1 to 7L4 constituting a coil assembly are disposed as shown in FIG. 5. In the arrangement example of the figure, an axial cross section of the arrangement is shown in a case where an image of a back of a human body with a backbone centered is picked up. The lower radio frequency coil assemblies 7L1 to 7L4 are disposed to a back of a tested person 2, and the loop coils 20, 21, and 22 and the cross coil 23 are shown. In FIG. 5, the coils 20 to 23 are constructed by using, for example, two sheets of one-side mounted FPCs and one sheet of double-side mounted FPC and fixedly supported within a plastic support member SP.

As described in FIGS. 2, 3, and 4, with respect to the lower radio frequency coil assemblies 7L1 to 7L4, in all the axes of the loop coils 20, 21, and 22, the radio frequency magnetic fields generated from the loop coils 20, 21, and 22 are substantially perpendicular to the radio frequency magnetic field generated from the cross coil 23. In this case, by performing an imaging process of the signals from the coils and an combining process, an excellent SNR can obtained in a wide range in comparison to a case where only the central loop coil 21 is subject to a QD process as well as a case where an image-picking-up process is performed by using only the loop coils.

Figure 6:
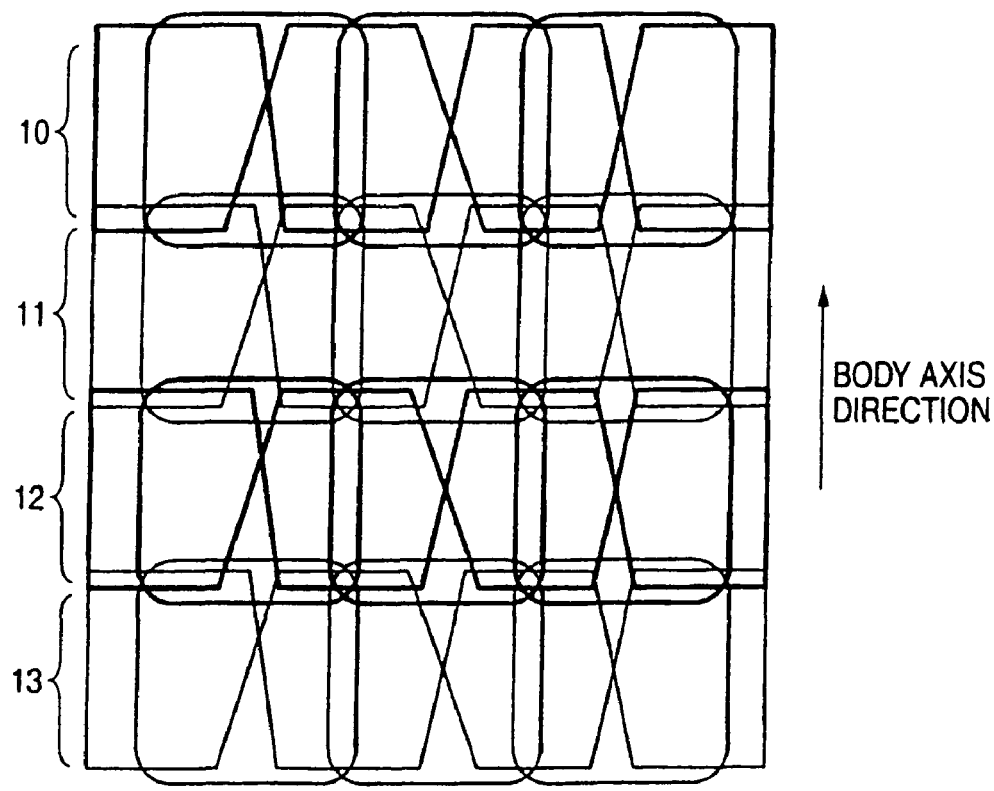
FIG. 6 is a view showing an arrangement of coils in a body axis direction in a case where a lower radio frequency coil assembly is constructed by arranging a plurality of the coil assemblies according to the first embodiment.

The aforementioned lower radio frequency coil assemblies 7L1 to 7L4 are disposed in a longitudinal direction (a body axis direction of a tested person P; z-axis direction) of the top board of the bed as shown in FIG. 6. Namely, four lower radio frequency coil assemblies 7L1 to 7L4 are arranged in a direction perpendicular to the array directions of the loop coils 20, 21, and 22 and the cross coil 23. By doing so, four lower radio frequency coil assemblies 7L1 to 7L4 are disposed on the top board T with the perpendicular direction thereof coincident with the longitudinal direction (the body axis direction of the tested person P) of the top board T.

In order to obtain the magnetically-decoupling between the adjacent coils arranged in both two-dimensional directions, the surface coils are disposed so that predetermined widths thereof overlap with each. In case of the loop coils, since the coupling between the coils arranged in a slanted direction is suppressed, it is not suitable to overlap the loop coils. For the reason, as shown in FIG. 7, decoupling circuits 55 are additionally provided between the loop coils 51 and 52 and between the loop coils 50 and 54.

Figure 7:
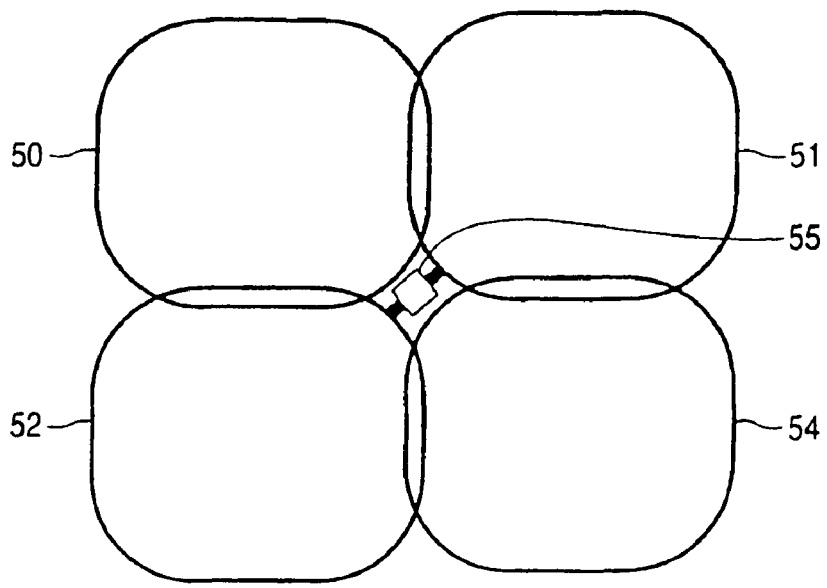
FIG. 7 is a view showing a shape of a take-out portion of a decoupling circuit between a plurality of coil assemblies.
Figure 8:
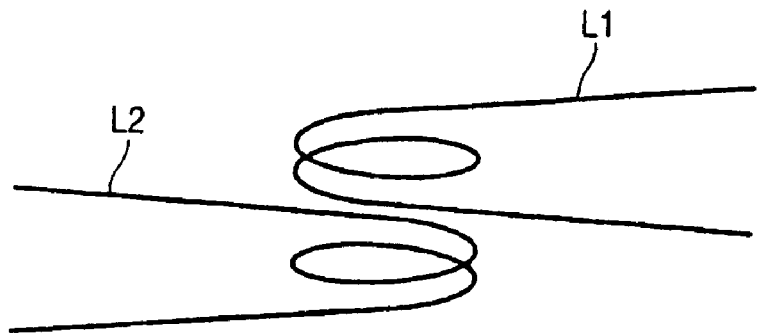
FIG. 8 is a view showing an example of a decoupling circuit.

FIG. 8 is a view showing an example of the decoupling circuit of FIG. 7. Inductance components L1 and L2 are serially connected to, for example, the loop coils 52 and 51, and the inductance components L1 and L2 are disposed to partially overlap with each other, so that the decoupling between the loop coils can be obtained.

Figure 9:
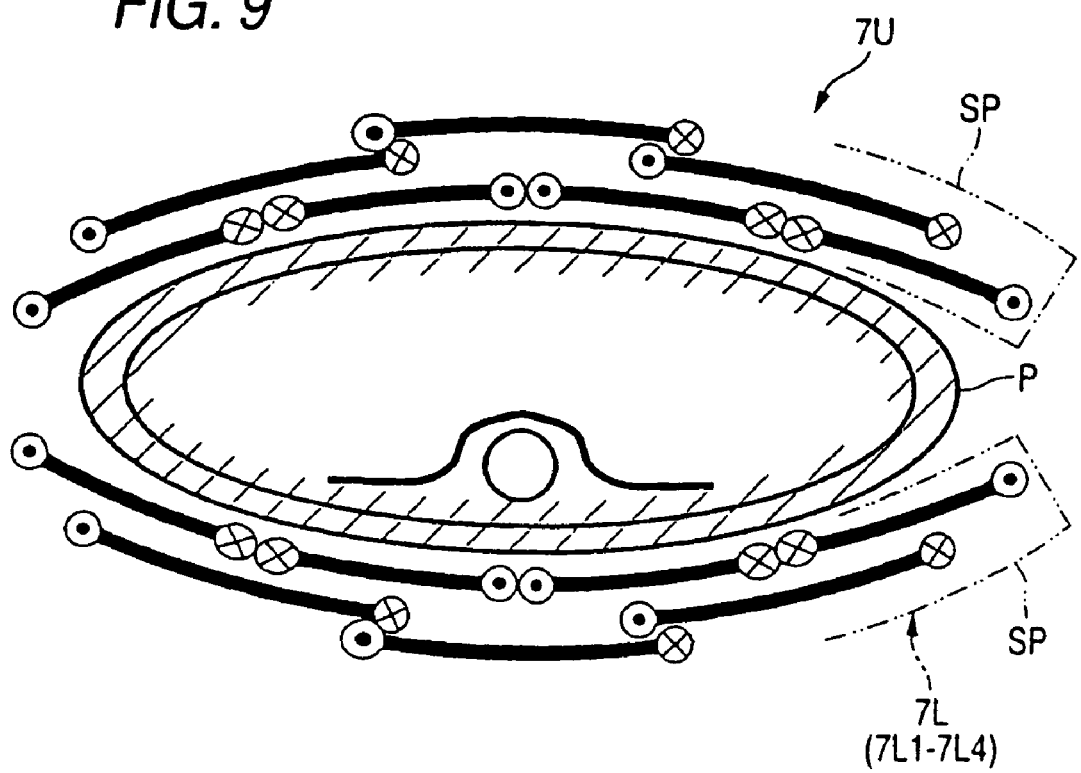
FIG. 9 is a view showing an axial surface in a case where upper and lower radio frequency coil assemblies employing the coil assembly according to the first embodiment are arranged to a body portion of a tested person.

In the first embodiment, the upper radio frequency coil assembly 7U has a construction which is substantially equal to those of the lower radio frequency coil assemblies 7L1 to 7L4. FIG. 9 shows an example where the upper radio frequency coil assembly 7U is disposed to the abdomen of the tested person P. In addition, the lower radio frequency coil assemblies 7L1 to 7L4 in an arrayed shape are always disposed to the back of the tested person P.

As a result, a portion of the lower radio frequency coil assemblies 7L1 to 7L4, for example, the coil assembly 7L1 and the upper radio frequency coil assembly 7U can cooperatively perform collecting signals from the abdomen. In this case, other lower radio frequency coil assemblies 7L2 to 7L4 are excluded in the signal collecting process.

In order not to receive the magnetic resonance signal transmitted from the remaining lower radio frequency coil assemblies 7L2 to 7L4, the exclusion of the lower radio frequency coil assemblies 7L2 to 7L4 may be implemented by providing a multiplexer to the receiver 8R or by performing a selection/non-selection software procedure in the receiver 8R or the calculation unit 10.

Figure 10:
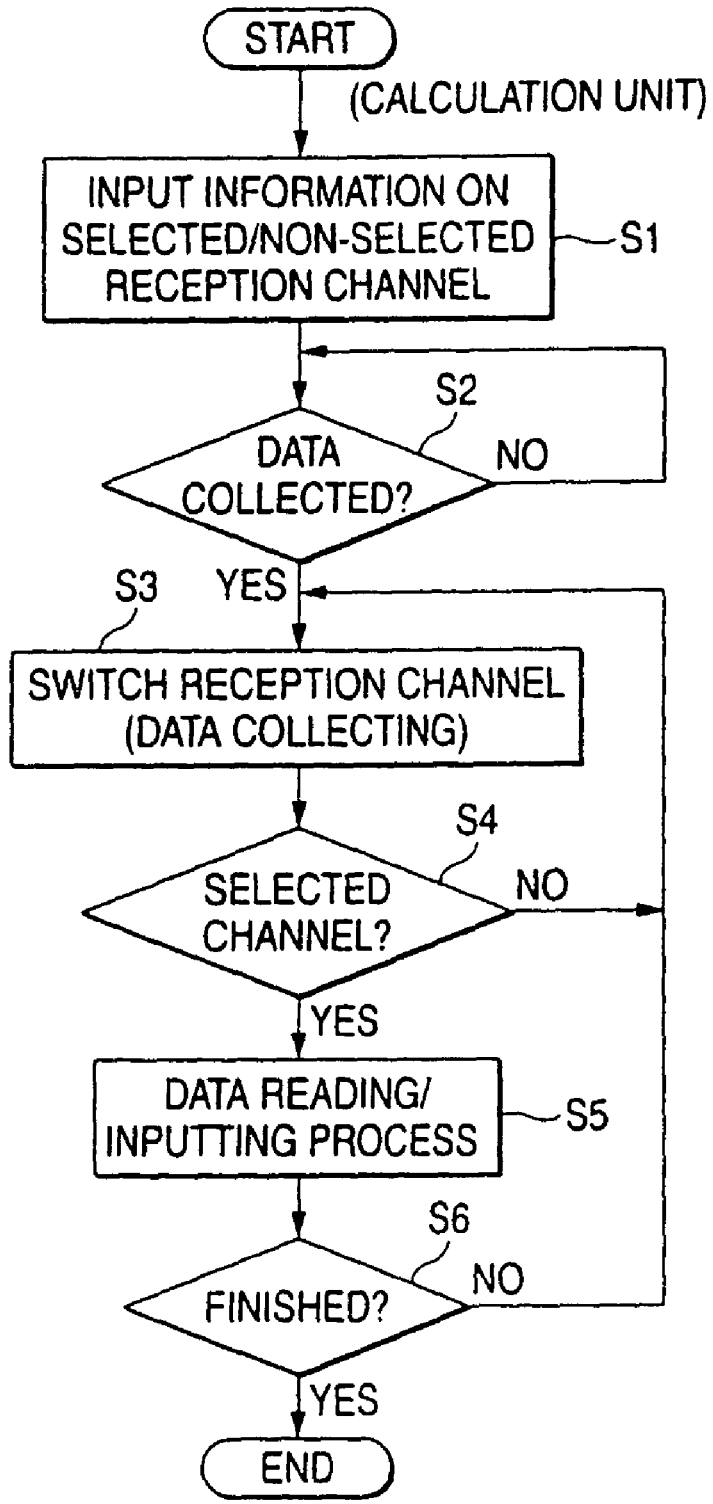
FIG. 10 is a schematic flowchart of a process for selecting or non-selecting collected data for reception channels.

FIG. 10 shows an example of the procedure in a case where the selection/non-selection software procedure is performed by the receiver 8R or the calculation unit 10. The calculation unit 10 reads in information indicating selected (or non-selected) reception channels determined according to conditions such as an image-picking-up condition and an image-picked-up portion (backbone or abdomen) from the host computer 6 (Step S1). Next, the calculation unit 10 determines whether or not the signal collection is commanded to start (Step S2). If the signal collection is commanded to start, the calculation unit 10 switches the reception channel to an initial cannel (Step S3).

Here, the reception channel is set to coils included in the upper and lower radio frequency coil assemblies 7U, 7L1 to 7L4. Namely, in the first embodiment, for example, since each of the coil assembly of the upper and lower radio frequency coil assemblies 7U and 7L1 to 7L4 employs the construction of the arrangement of FIG. 2, there are 20 channels (4 channels×5 sets=20 channels).

The calculation unit 10 determines based on the read-in information of Step S1 whether or not the switched reception channel is a non-selected reception channel, and if it is the non-selected reception channel, the calculation unit 10 switches the channel into the next reception channel (Steps S3 and S4). On the contrary, if the switched reception channel is a selected reception channel, the calculation unit 10 receives a signal (collected data) from the channel and stores the signal (Step S5). A series of the process of Steps S3 to S5 repeat until the data collection is completed (Step S6). As a result, only the data collected from the selected reception channel is received to be provided to the image reconstruction. The data collected from the non-selected reception channel is discarded but not received.

In addition, by using the selection/non-selection process, the upper radio frequency coil assembly 7U together with the lower radio frequency coil assemblies 7L1 to 7L4 may be provided in advance, and when the backbone is scanned, only the data collection of the reception channels corresponding to the lower radio frequency coil assemblies 7L1 to 7L4 may be selectively performed.

Like this, according to the first embodiment, it is possible to pick up an image of a plurality of desired portions of a plurality of tested persons P in a state that al least the lower radio frequency coil assemblies 7L1 to 7L4 among the reception radio frequency coils 7R are always disposed on the top board T. Namely, when an image of backbone of one tested person P is picked up, the lower radio frequency coil assemblies 7L1 to 7L4 can be used to receive the magnetic resonance signal from the tested person P. Here, each of the lower radio frequency coil assemblies 7L1 to 7L4 is constructed with surface coils, and as shown in FIGS. 2 and 4, the cross coil 23 which covers a region substantially equivalent to the image-picked-up regions of the loop coils 20, 21, and 22 is disposed. Therefore, since all the loop coils 20, 21, and 22 have the QD effect, it is possible to greatly increase the SNR of the lower radio frequency coil assemblies 7L1 to 7L4 and to improve the sensitivities thereof in comparison to a conventional case where the cross coil 23 is disposed so as to allow only the central loop coil (the loop coil 21 in the example of FIG. 2) to have the QD effect. By doing so, it is possible to collect signals from a deeper position of the tested person P. As a result, in case of a tested obese person P of which backbone is located in a relatively long distance from the top board T, it is possible to pick up an image of the backbone with a good SNR.

In addition, when an image of abdomen of the next tested person P is picked up, the lower radio frequency coil assemblies 7L1 to 7L4 remain in the previous state, and the upper radio frequency coil assembly 7U is disposed on the abdomen of the next tested person P. By doing so, the lower radio frequency coil assemblies 7L1 to 7L4 are disposed to the back of the tested person P, and the upper radio frequency coil assembly 7U is disposed in front of the abdomen. In this case, by using the aforementioned software procedure of FIG. 10, the data collection of, for example, the first coil assembly 7L1 among the lower radio frequency coil assemblies 7L1 to 7L4 is selected, and the data collection of the other coil assemblies 7L2 to 7L4 are non-selected. As a result, in case of the abdomen, the upper radio frequency coil assembly 7U and the lower radio frequency coil assembly 7L1 are disposed to surround the front and rear sides of the abdomen, so that it is possible to pick up an image of abdomen with a good SNR. Alternatively, the upper radio frequency coil assembly 7U may be constructed with only the loop coils. Alternatively, the data collection of the loop coils 20, 21, and 22 among the coil assemblies of the lower radio frequency coil assembly 7L1 may be selected. As a result, it is possible to pick up an image of abdomen by using only the loop coils.

Like this, although the tested persons are changed, the lower radio frequency coil assemblies 7L1 to 7L4 may be always disposed, and when the tested portion is changed into abdomen, some coils of the lower radio frequency coil assembly 7L1 may also be used to pick up an image of the abdomen. In summary, when images of different portions (typically, backbone and abdomen) of a tested person P are picked up, the construction of the surface coils can be commonly used as a plurality of the reception radio frequency coils 7R, and signals can be collected from the image-picked-up portions with optimal sensitivities.

For this reason, it is possible to greatly reduce the burden to an operator which performs changing with different types of the reception radio frequency coils 7R for different tested persons or different image-picked-up portions thereof. Therefore, the task load for the operator preparing the image-picking-up process can be reduced, so that it is possible to increase patient throughput. In summary, even in a case where images of different portions (typically, backbone and abdomen) of a tested person P are picked up, the task burden of changing the reception radio frequency coils 7R is reduced, and magnetic resonance signals can be collected from a plurality of portions with optimal sensitivities, so that it is possible to increase patient throughput.

MODIFIED EXAMPLES

Figure 11:
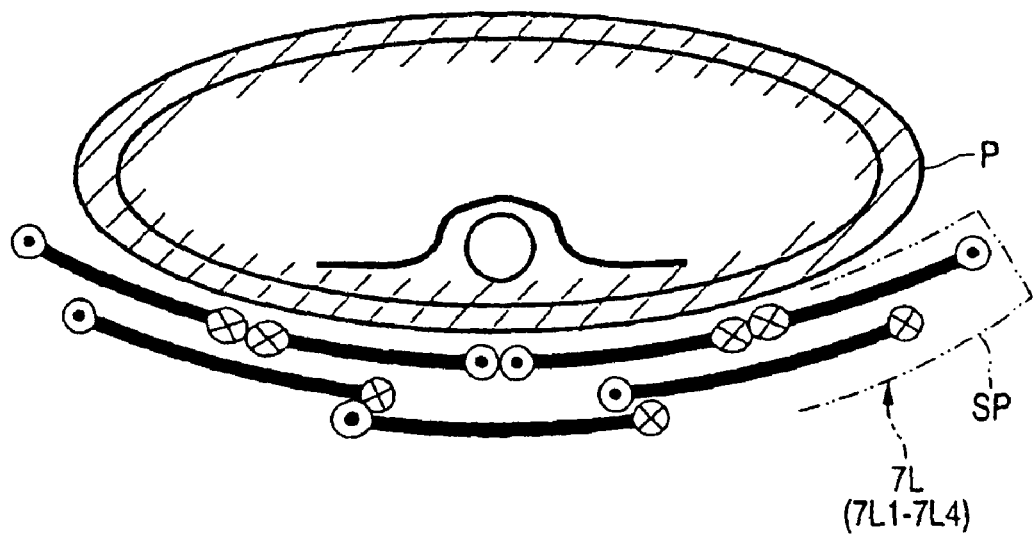
FIG. 11 is a view showing an example of an arrangement of a lower radio frequency coil assembly (a supporting member) which is curved according to a roundness of a back of a tested person.

FIG. 11 is a view showing an example of modifying an arrangement of the coil assembly for the tested person P similarly to the above-described FIG. 9. A supporting member SP is curved in accordance with a body shape of the tested person, so that the coil assembly is in close contact with a body surface of the tested person P. As a result, it is possible to obtain a better SNR.

Figure 12:
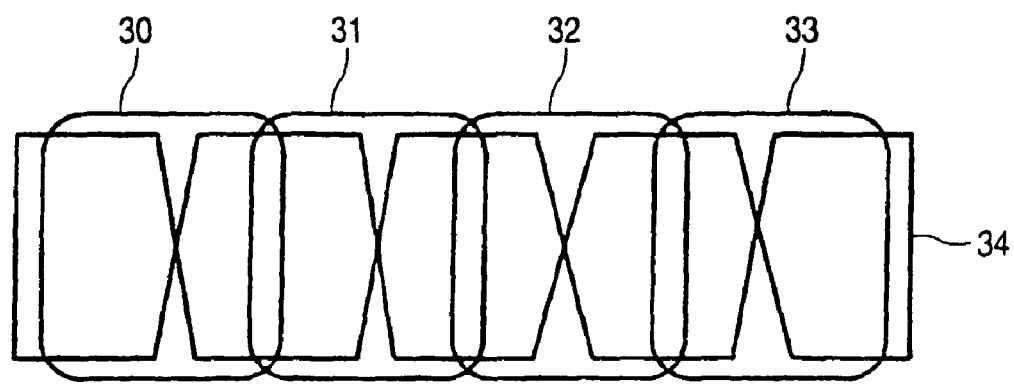
FIG. 12 is a schematic view showing an example of an arrangement of other coils of a coil assembly according to a first modified example of the first embodiment.

FIG. 12 is a view showing an example of an arrangement of four loop coils. In order to implement decoupling, loop coils 30, 31, 32, and 33 are disposed to overlap with each other by a predetermined width. In this case, in order to implement electrically decoupling from the loop coils, a cross coil 34 is designed so that the current paths of the loop coils cross each other. By doing so, the directions of the radio frequency magnetic fields generated in the axes of the loop coils are substantially perpendicular (90°) to the direction of the radio frequency magnetic field generated from the cross coil 34, and since the cross coil 34 is additionally provided, so that it is possible to obtain a better SNR than a case of using only the loop coils 30, 31, 32, and 33.

Figure 13:
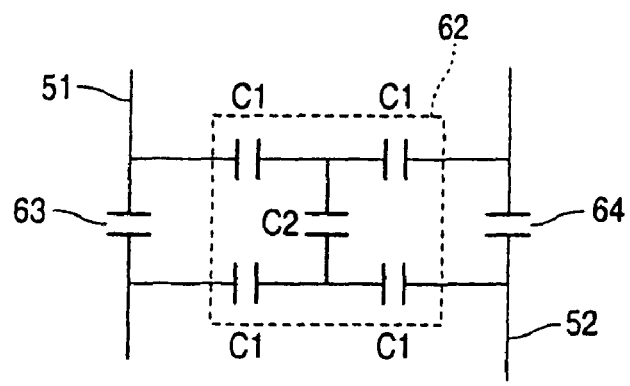
FIG. 13 is a view showing another example of a decoupling circuit of a coil assembly according to a second modified example of the first embodiment.

FIG. 13 is a view showing another example of the decoupling circuit of FIG. 7. Capacitors 63 and 64 are serially connected to the loop coils 51 and 52, respectively, so that a capacitor network 62 is attached between the capacitors. The decoupling can be implemented by adjusting capacitances C1 and C2 of the capacitors of the capacitor network 62.

Figure 14:
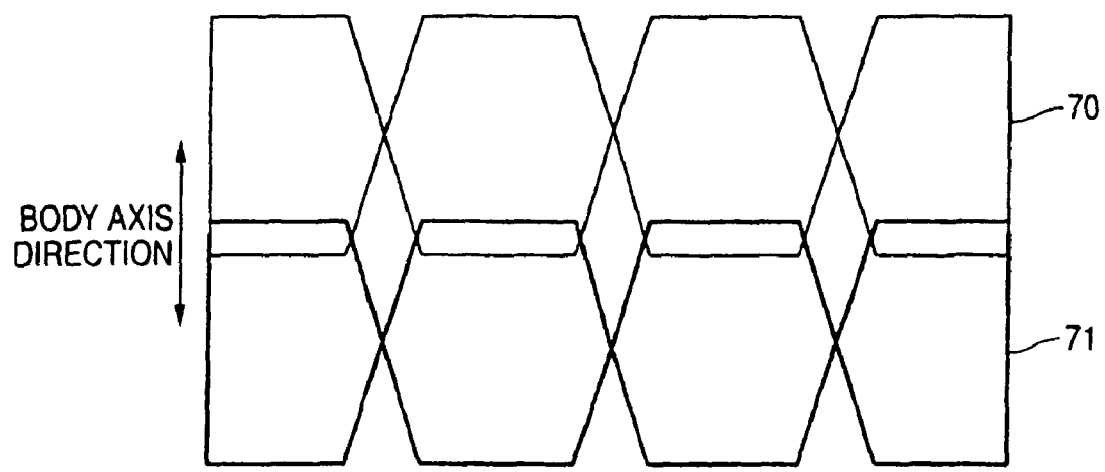
FIG. 14 is a view showing an example of a coil arrangement for decoupling cross coils between adjacent coil assemblies according to a third modified example of the first embodiment.

FIG. 14 is a view showing an example of an arrangement for decoupling cross coils of FIG. 6. By overlapping suitable areas of the cross coils 70 and 71, the magnetic flux linked between the coils can be zero, so that the decoupling can be obtained.

Figure 15:
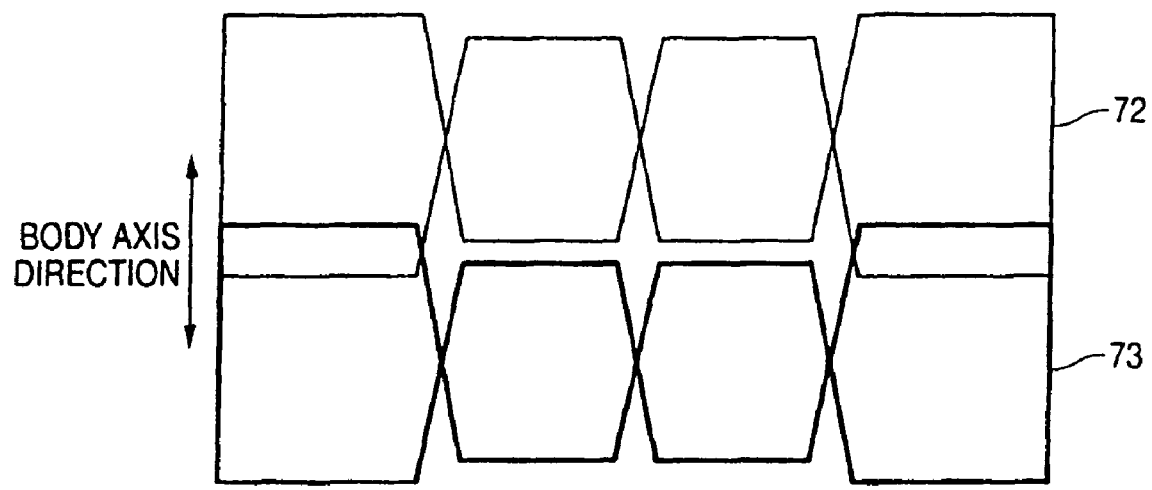
FIG. 15 is a view showing an example of a coil arrangement for decoupling cross coils between adjacent coil assemblies according to a fourth modified example of the first embodiment.

FIG. 15 is a view showing another example of an arrangement for decoupling cross coils of FIG. 6. In this case, only the loops at both of the outer side in a direction perpendicular to the body axis direction of the cross coils 72 and 73 overlap with each other by a suitable width in the body axis direction. By doing so, the magnetic flux linked between the coils can be zero, so that the decoupling can be obtained.

Figure 16:
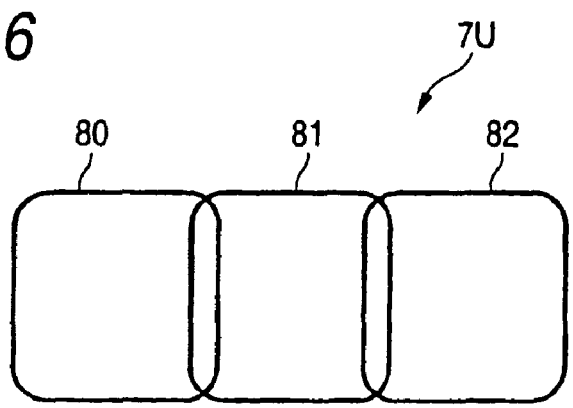
FIG. 16 is a view showing an upper radio frequency coil assembly according to a fifth modified example of the first embodiment.
Figure 17:
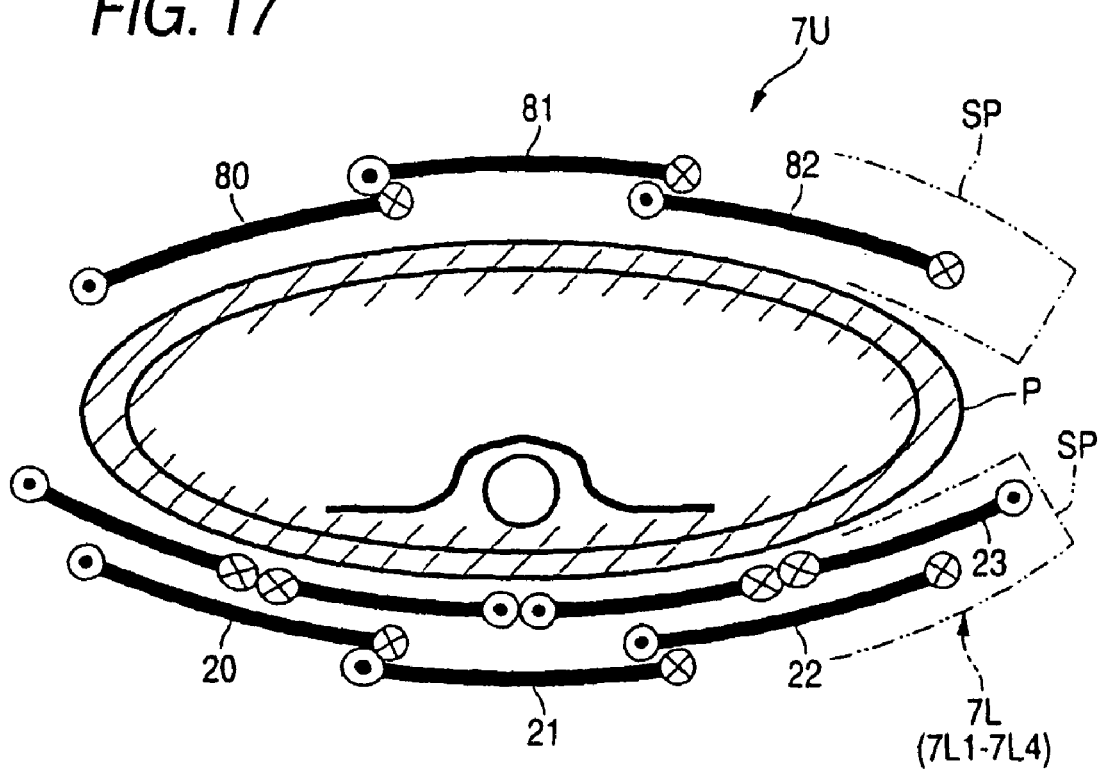
FIG. 17 is a view showing an axial surface in a case where a lower radio frequency coil assembly and the upper radio frequency coil assembly shown in FIG. 16 are arranged to a body portion of a tested person.

FIGS. 16 and 17 are views showing other examples of the coil assembly according to the invention. Since the coil assembly disposed to the abdomen of the tested person P has a function of picking up an image of backbone, the coil assembly is constructed by using the cross coil 23 and the loop coils 20, 21, and 22, and the surface coil disposed to the abdomen may not be constructed by using a cross coil. In this case, as shown in FIGS. 16 and 17, the coil assembly disposed to the abdomen may be constructed by using only the loop coils 80, 81, and 82.

In addition, in the coil arrangement examples described in FIGS. 9, 16, and 17, some portions of the coil assembly used to pick up an image of backbone can also be used to pick up an image of abdomen. As described above, among the coils, the cross coil 23 is additionally provided to pick up the image of the backbone region with a good SNR. Therefore, in case of picking up an image of abdomen, although there is a cross coil, the cross coil may not be used, and the data collection may be selectively performed by using only the loop coils 20, 21, and 22 having the construction shown in FIGS. 9, 16, and 17. This is because the SNR for the center of abdomen is not improved by using the cross coil, and only the loop coils surrounding the tested person are sufficiently suitable. Sine the addition of the reception channels for the data collection result in increase in data amount or calculation time, it is important to avoid unnecessary additional reception channels. As an example, the selection process can be implemented by using the processes shown in FIG. 10.

Figure 18:
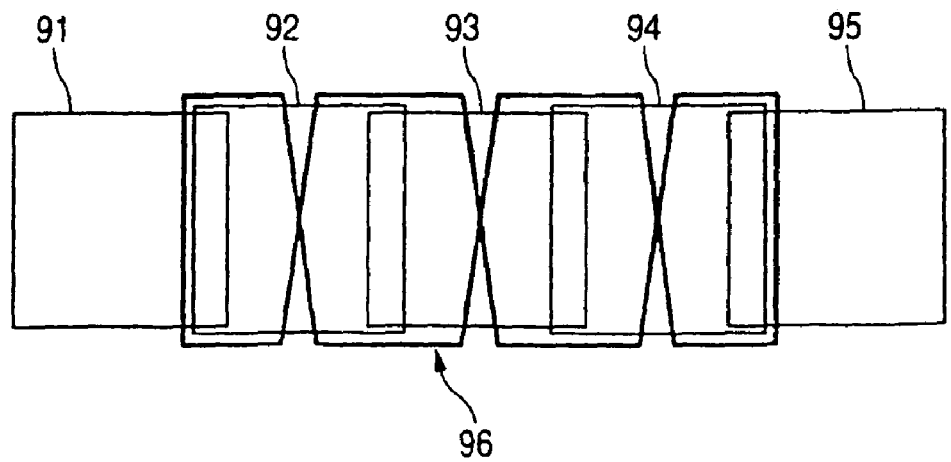
FIG. 18 is a view showing a coil assembly according to a sixth modified example of the first embodiment.

FIG. 18 shows another modified example of the coil assembly according to the invention. As shown in the figure, the coil assembly according to the modified example includes N loop coils 91 to 95 and a single cross coil 96, and the crossing times of the cross coil 96 is less than N. Like this, in a case where the crossing times of the cross coil is smaller than the number of the loop coils, a size (crossing times) of the cross coil may be adjusted in accordance with a region where the sensitivity needs to be improved.

In addition, a method of processing the signals from the surface coils can be modified. In the aforementioned embodiment, the received signals output from the surface coils are sampled through independent reception channels. However, a combining/dividing circuit for combining or dividing signals from some of the surface coils may be provided. By doing so, the data which are subject to the combining/dividing process in the combining/dividing circuit can be sampled, it is possible to perform various signal processes.

Second Embodiment

Figure 19:
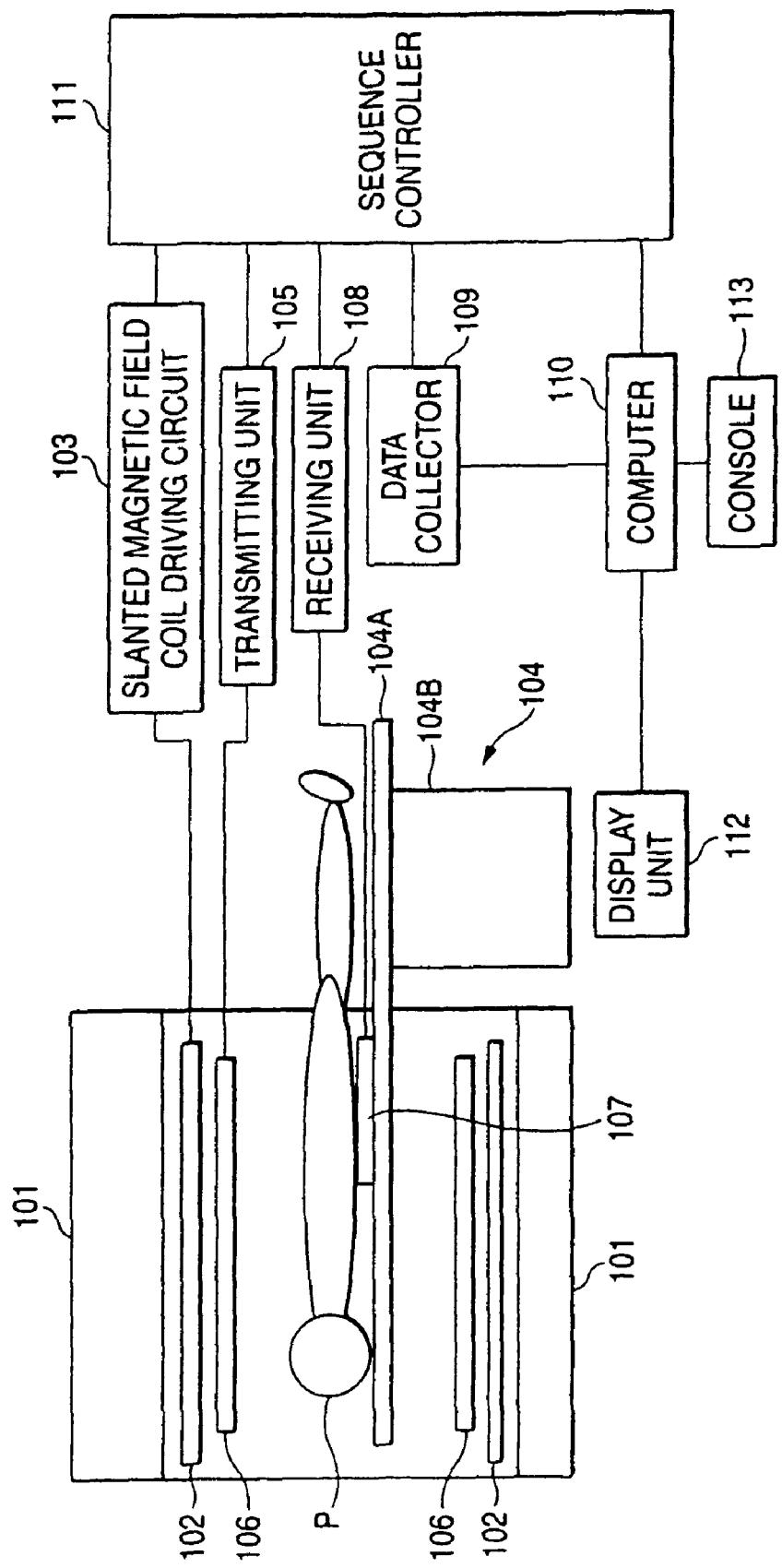
FIG. 19 is a view showing a construction of an MRI apparatus according to a second embodiment of the invention.

FIG. 19 is a view showing a construction of an MRI apparatus according to a second embodiment of the invention.

The MRI apparatus includes static magnetic field magnet 101, a gradient magnetic field coil 102, a gradient magnetic field coil driving circuit 103, a bed 104, a transmitting unit 105, a transmission radio frequency coil 106, a reception radio frequency coil assembly 107, a receiving unit 108, a data collector 109, a computer 110, a sequence controller 111, a display unit 112, and a console 113.

The static magnetic field magnet 101 has a shape of a hollow cylinder to generate a uniform static magnetic field in an inner space thereof. As an example of the static magnetic field magnet 101, a permanent magnet, a superconductive magnet, or the like may be used. The gradient magnetic field coil 102 is disposed in a hollow cylindrical inner space of the static magnetic field magnet 101. The gradient magnetic field coil 102 is constructed by combining three coils corresponding to three axes of X, Y, and Z axes. In the gradient magnetic field coil 102, the three coils are individually supplied with currents from the gradient magnetic field coil driving circuit 103, so that gradient magnetic fields of which magnetic field strengths vary with respect to X, Y, and Z axes are generated. For example, the Z-axis direction may be equal to the static magnetic field. For example, the gradient magnetic fields of the X, Y, and Z axes correspond to a slice-selection gradient magnetic field $G_S$, a phase-encode gradient magnetic field $G_E$, and a read-out gradient magnetic field $G_R$. The slice-selection slanted magnetic field $G_S$ is used to determine an arbitrary imaging cross section. The phase-encode gradient magnetic field $G_E$ is used to encode a phase of the magnetic resonance signal according to a spatial position thereof. The read-out gradient magnetic field $G_R$ is used to encode a frequency of the magnetic resonance signal according to the spatial position.

The tested body P is loaded on a top board 104A of the bed 104 and inserted into a hollow opening (an imaging opening) of the gradient magnetic field coil 102. The top board 104A is supported by a base portion 104B and moves in a longitudinal direction thereof (left and right directions in FIG. 19) and up and down directions. In general, the bed 104 is disposed so that the longitudinal direction is parallel to a central axis of the static magnetic field magnet 101.

The transmitting unit 105 emits an RF pulse corresponding to Larmor frequency in order to supplying the RF pulse to the radio frequency coil 106. The radio frequency coil 106 is disposed in an inner side of the gradient magnetic field coil 102. The radio frequency coil 106 is disposed in an inner side of the gradient magnetic field coil 102. The radio frequency coil 106 is supplied with the radio frequency pulse (RF pulse) from the transmitting unit 105 and generates a radio frequency magnetic field.

The radio frequency coil assembly 107 is disposed on a top board 104A. The radio frequency coil assembly 107 induces the magnetic resonance signal emitting from the tested body to the receiving unit 108. The receiving unit 108 amplifies the magnetic resonance signal induced by the radio frequency coil assembly 107 and performs detection. The data collector 109 collects the magnetic resonance signal output from the receiving unit 108 and performs A/D conversion. The computer 110 performs an image reconstruction process based on the magnetic resonance signal output from the data collector 109.

The sequence controller 111 controls the slanted magnetic field coil driving circuit 103, the transmitting unit 105, the receiving unit 108, the data collector 109, and the computer 110 so as to perform an imaging operation according to a predetermined sequence.

The display unit 112 displays the reconstructed image or other types of information under the control of the computer 110.

The console 113 receives various commands and information input from an operator.

Figure 20:
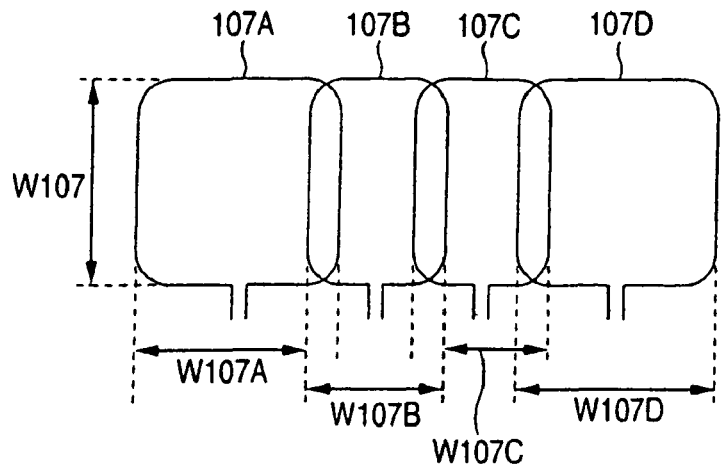
FIG. 20 is a view showing an arrangement of loop coils of a radio frequency coil assembly shown in FIG. 19.

As shown in FIG. 20, the radio frequency coil assembly 107 includes four loop coils 107A, 107B, 107C, and 107D. The loop coils 107A, 107B, 107C, and 107D are arranged so that loop planes thereof are directed in the same direction and adjacent ones partially overlap with each other. Hereinafter, the direction in which the loop coils 107A, 107B, 107C, and 107D are arranged is called an array direction. With respect to the array direction, the loop coils 107B and 107C are disposed in an inner side, and the loop coils 107A and 107D are disposed in an outer side with the loop coils 107B and 107C interposed therebetween. In addition, the loop coils 107A, 107B, 107C, and 107D are electrically insulated from each other.

It is preferable that the central axes in directions perpendicular to the array directions of the loop coils 107A, 107B, 107C, and 107D are disposed in a straight line as seen from a direction thereof intersecting the loop planes. However, in terms of design, it may be difficult to dispose the loop coils in a strictly straight line, so that it may be disposed in a zigzag to some degree.

In addition, the loop coils 107A, 107B, 107C, and 107D may be disposed on a single-layered substrate.

Widths W107B and W107C of the loop planes of the loop coils 107B and 107C in the array directions thereof are smaller than widths W107A and W107D of the loop planes of the loop coils 107A and 107D in the same directions. In the second embodiment, the widths W107B and W107C are equal to each other, and the widths W107A and W107D are equal to each other. However, if the aforementioned conditions are satisfied, these widths may be different from each other.

The widths of the loop planes of the loop coils 107A, 107B, 107C, and 107D in the directions perpendicular to the arraignment directions are all the same as W7. For the reason, areas S107B and S107C of the loop planes of the loop coils 107B and 107C are smaller than areas S107A, S107D of the loop planes of the loop coils 107A and 107D. In addition, the areas S107A, S107B, S107C, and S107D are areas of the hatched regions shown in (a) to (d) of FIG. 21. The widths of the loop planes of the loop coils 107A, 107B, 107C, and 107D in the direction perpendicular to the array directions may be different from each other.

In order to suppress the electrical coupling between two loop coils, the overlapping areas of the coil planes of the two loop coils is defined to be such a suitable area that a total sum of the radio frequency magnetic field generated therefrom in the loop is zero.

In a case where sizes of the coils are different, the overlapping areas between the adjacent coils are not always equal to each other.

The radio frequency coil assembly 107 is disposed on the top board 104A so that the loop planes of the loop coils 107A, 107B, 107C, and 107D are directed along the upper surface of the top board 104A and the array direction is defined to be a direction intersecting the longitudinal direction of the top board 104A. As a result, the loop planes of the loop coils 107A, 107B, 107C, and 107D are directed to the tested body P which is loaded on the top board 104A. Since the tested body P is loaded on the top board 104A in a state that the body axis direction is directed to the longitudinal direction of the top board 104A, the array direction of loop coils 107A, 107B, 107C, and 107D intersects the body axis direction of the tested body P.

Figure 21:
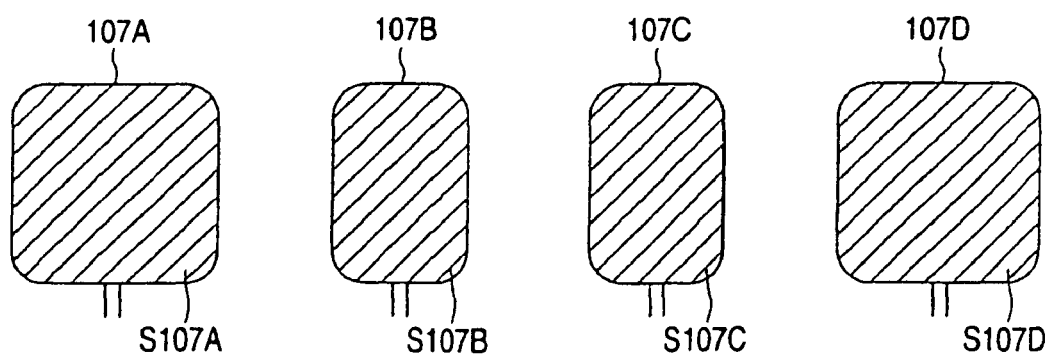
FIG. 21 is a view showing areas of overlap portions and areas of loop surfaces of loop coils shown in FIG. 20.
Figure 21:
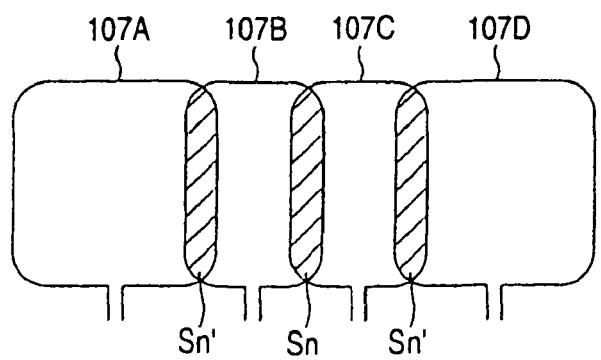

As shown in (e) of FIG. 21, areas of three overlapping portions are denoted by Sn and Sn'. In this case, sizes of the loop coils 107A, 107B, 107C, and 107D are defined so that k1 and k2 obtained from the following equations, for example, are in a range of from 0.35 to 0.65.

$$k1 = S107A/(S107B + S107C - Sn)$$

$$k2 = S107D/(S107B + S107C - Sn)$$

Figure 22:
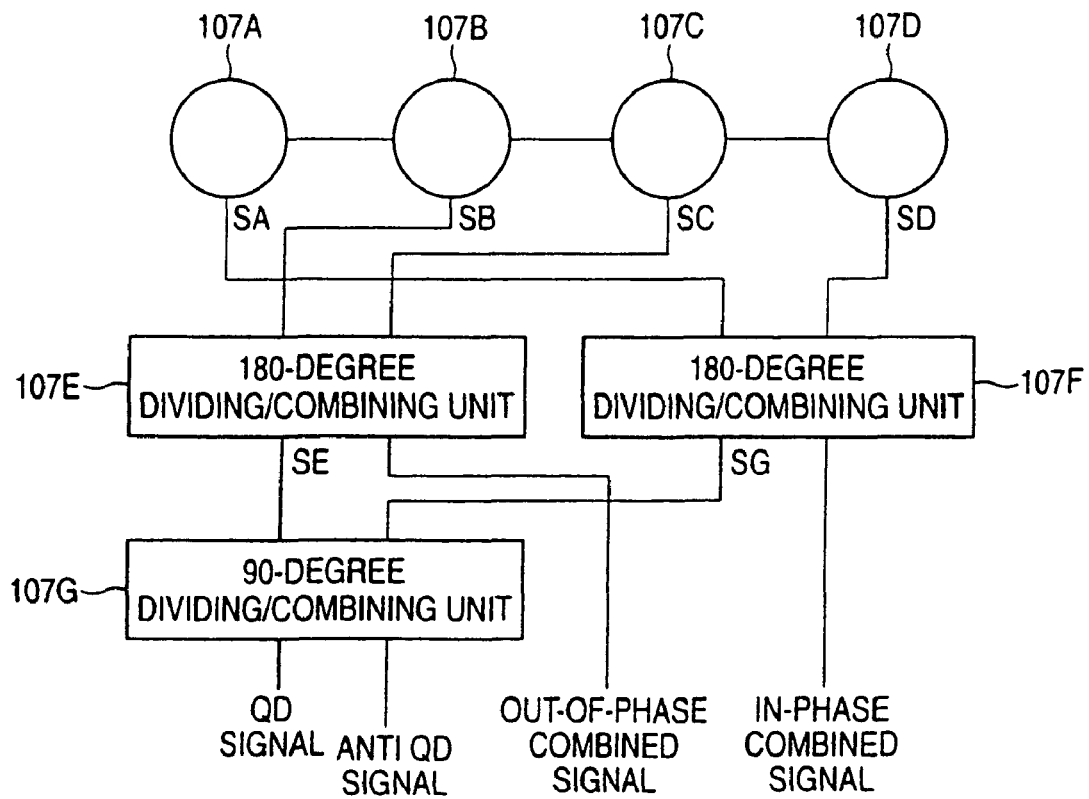
FIG. 22 is a view showing a construction of a signal processing circuit of the radio frequency coil assembly shown in FIG. 19.

As shown in FIG. 22, the radio frequency coil assembly 107 may further include 180-degree dividing/combining units 107E and 107F and a 90-degree dividing/combining unit 107G.

In the 180-degree dividing/combining unit 107E, signals SB and SC output from the loop coils 107B and 107C are input through a synchronization/match circuit (not shown) to a coaxial cable thereof. The 180-degree dividing/combining unit 107E performs in-phase and out-of-phase combining processes on the signals SB and SC. The 180-degree dividing/combining unit 107E outputs a signal SE obtained from the in-phase combining process to the 90-degree dividing/combining unit 107G. The 180-degree dividing/combining unit 107E transmits a signal obtained from the out-of-phase combining process to the receiving unit 108.

In the 180-degree dividing/combining unit 107F, signals SA and SD output from the loop coils 107A and 107D are input through a synchronization/match circuit (not shown) to a coaxial cable thereof. The 180-degree dividing/combining unit 107F performs in-phase and out-of-phase combining processes on the signals SA and SD. The 180-degree dividing/combining unit 107F transmits a signal obtained from the in-phase combining process to receiving unit 108. The 180-degree dividing/combining unit 107F outputs a signal SG obtained from the out-of-phase combining process to the 90-degree dividing/combining unit 107G.

The 90-degree dividing/combining unit 107G performs a 90-degree-phase shifting process on the signal SG and, after that, combines the phase-shifted signal with the next signal SE. The 90-degree dividing/combining unit 107G transmit a QD signal, that is, a signal obtained from the combining process, and an AntiQD signal, that is, a out-out-phase signal of the QD signal, to the receiving unit 108.

Figure 23:
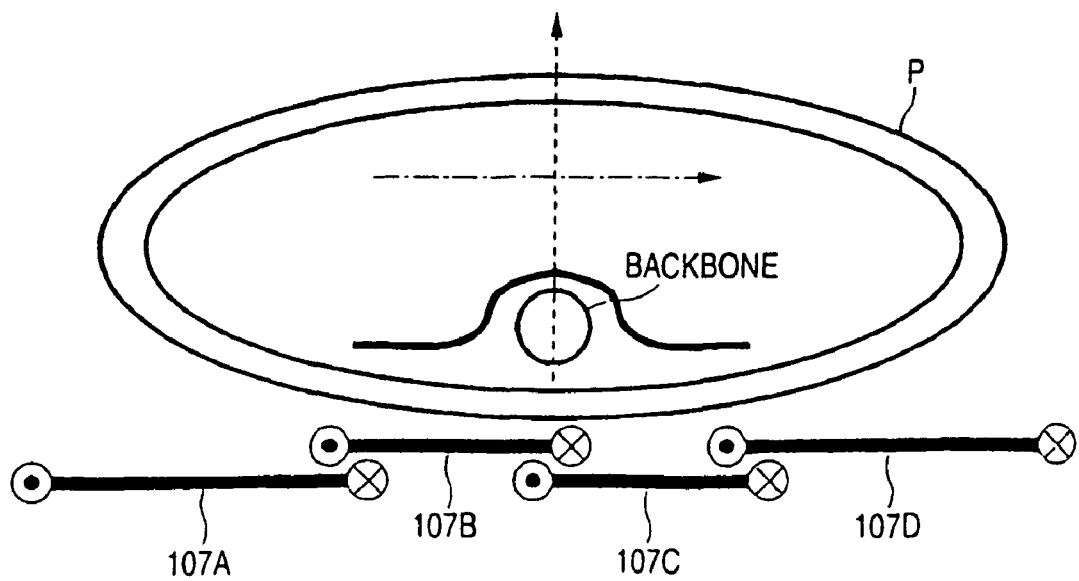
FIG. 23 is an axial cross sectional view showing a positional relation between a tested person P and the radio frequency coil assembly 107 in a case where an image of backbone of the tested person is picked up by using the MRI apparatus shown in FIG. 19.

FIG. 23 is an axial cross sectional view showing a positional relation between a tested person P and the radio frequency coil assembly 107 in a case where an image of backbone of the tested person is picked up by using the MRI apparatus shown in FIG. 19.

As shown in FIG. 23, the loop coils 107B and 107C are disposed in the vicinity of the backbone. Distances of the loop coils 107A and 107D from the backbone are larger than those of the loop coils 107B and 107C. A sensitivity of the loop coil increases in reverse proportional to an area of a coil plane. However, the smaller the area of the coil plane is, the narrower a range of the sensitivity of the loop coil is. Namely, it is possible to obtain a magnetic resonance signal emitting from the backbone in the vicinity of the loop coils 107B and 107C with a high sensitivity. On the other hand, the loop coils 107A and 107D can obtain a magnetic resonance signal emitting from the backbone at a position so far apart therefrom with a good sensitivity.

In a case where the loop coils 107B and 107C are changed to have the same sizes as those of the loop coils 107A and 107D in the second embodiment, the areas of the loop coils 107B and 107C and distances of the loop coils 107A and 107D from the backbone increase more than those of the second embodiment. Therefore, all the sensitivities of the loop coils 107A, 107B, 107C, and 107D to the magnetic resonance signals emitting from the backbone are lowered. On the contrary, in a case where the loop coils 107A and 107D are changed to have the same sizes as those of loop coils 107B and 107C in the second embodiment, the sensitivities of the loop coils 107A and 107D to the magnetic resonance signals emitting from the backbone are lowered.

As a result, the radio frequency coil assembly 107 of the second embodiment can increase SN ratios for both of the near and far portions in comparison to a case where the four equally-sized loop coils are arranged. Namely, an imaging sensitivity for a localized portion of an image-picked-up object is obtained by using the loop coils 107B and 107C, and an imaging sensitivity for a near portion of the image-picked-up object is added thereto by using the loop coils 107A and 107D, so that it is possible to improve the SN ratio for the imaging the imaging-picked-up object. As a result, it is possible to efficiently pick up an image with a good SN ratio. In addition, due to the characteristics, the radio frequency coil assembly 107 is suitable to pick up an image of the backbone or abdomen.

In addition, according to the second embodiment, since QD signal is formed by using a QD combining process, the SN ratio thereof increases more than the SN ratios of the output signals of the loop coils 107A, 107B, 107C, and 107D.

Therefore, in a case where the number of channels of the receiving unit 108 is small, the QD signal is used so as to effectively use the small number of the channels, so that it is possible to pick up an image with a good SN ratio. More specifically, if the receiving unit 108 has four channels due to the radio frequency coil assembly 107, a QD signal, an AntiQD signal, an in-phase combined signal, and out-of-phase combined signal are used. However, if the receiving unit 108 has only two channels, QD signal and one of in-phase and out-out-phase combined signals are used.

Third Embodiment

Figure 24:
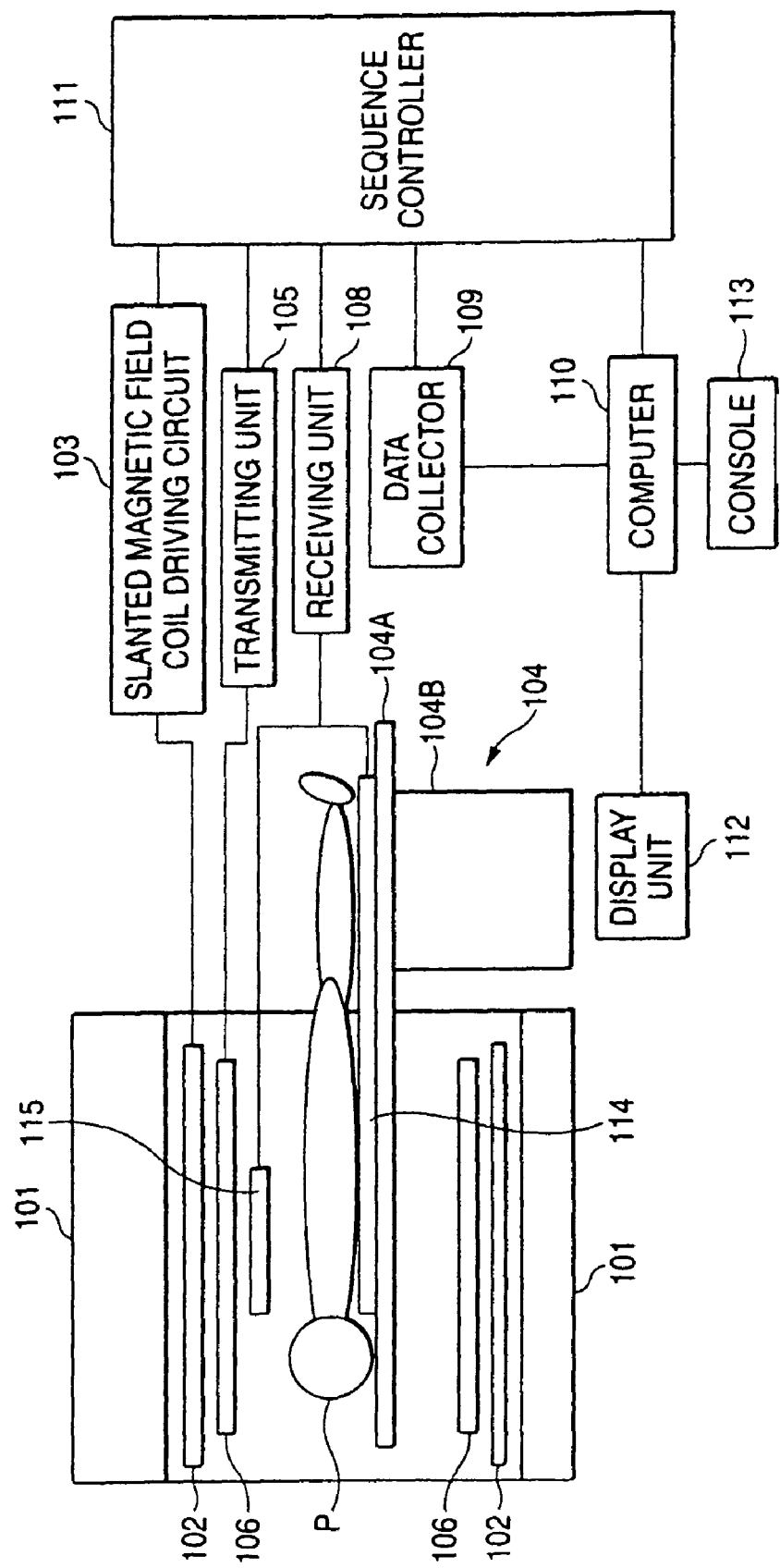
FIG. 24 is a view showing a construction of an MRI apparatus according to a third embodiment of the invention.

FIG. 24 is a view showing a construction of an MRI apparatus according to a third embodiment of the invention. In FIG. 24, the same elements as those in FIG. 19 are denoted by the same reference numerals, and detailed description thereof is omitted.

The MRI apparatus includes a static magnetic field magnet 101, a slanted magnetic field coil 102, a gradient magnetic field coil driving circuit 103, a bed 104, a transmitting unit 105, a transmission radio frequency coil 106, a receiving unit 108, a data collector 109, a computer 110, a sequence controller 111, a display unit 112, a console 113, and transmission radio frequency coil assemblies 114 and 115.

Namely, the MRI apparatus according to the third embodiment includes the radio frequency coil assemblies 114 and 115 instead of the radio frequency coil assembly 107 in the second embodiment.

The radio frequency coil assembly 114 is disposed on a top board 104A. The radio frequency coil assembly 115 is disposed in an upper portion of an inner side of the gradient magnetic field coil 102. The radio frequency coil assemblies 114 and 115 induce a magnetic resonance signal emitting from a tested body to the receiving unit 108.

Figure 25:
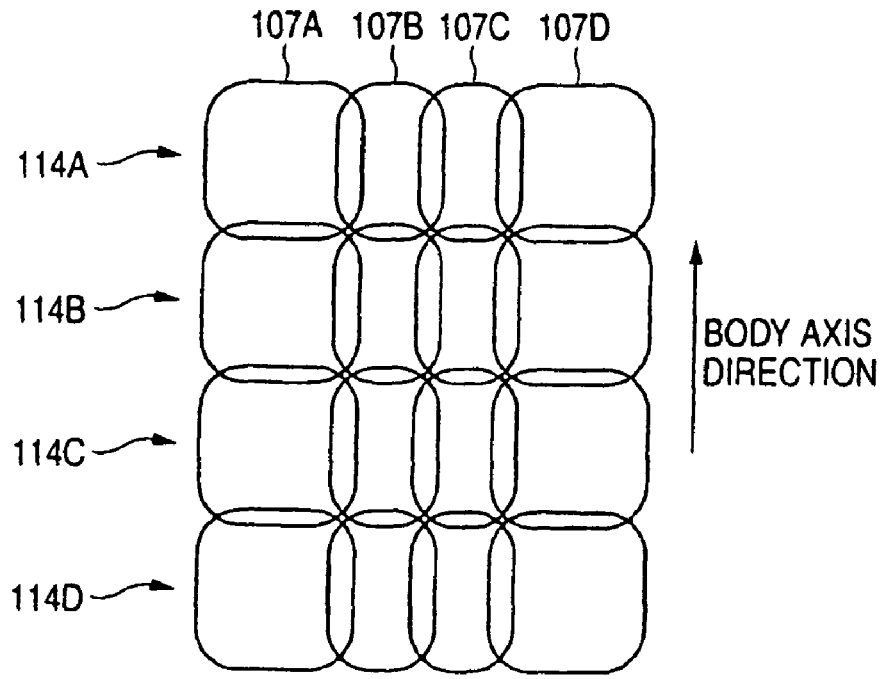
FIG. 25 is a view of an arrangement of a coil set of a radio frequency coil assembly shown in FIG. 24.

As shown in FIG. 25, the radio frequency coil assembly 114 includes four coil sets 114A, 114B, 114C, and 114D. Each of the coil sets 114A, 114B, 114C, and 114D includes loop coils 107A, 107B, 107C, and 107D. The coil sets 114A, 114B, 114C, and 114D are arranged in a direction intersecting the array directions of the loop coils 107A, 107B, 107C, and 107D. The coil sets 114A, 114B, 114C, and 114D are arranged so that adjacent ones partially overlap with each other. The array directions of the coil sets 114A, 114B, 114C, and 114D are coincident with a longitudinal direction of the top board 104A, that is, the body axis direction of the tested body P.

Figure 26:
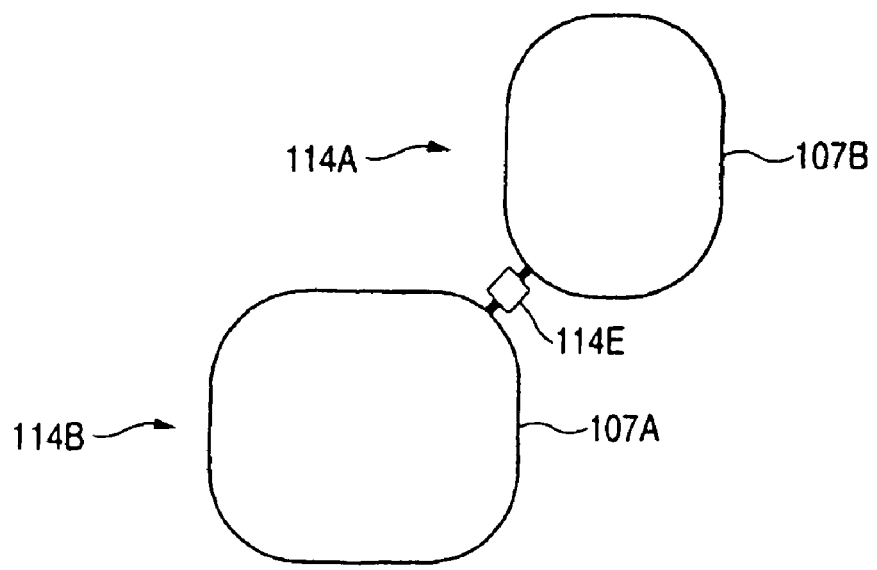
FIG. 26 is a view showing an attachment state of a decoupling circuit.

It is not preferable that the loop coils adjacent to each other in a slanted direction with respect to the array directions of the coil sets 114A, 114B, 114C, and 114D overlap with each other so as to suppress coupling between the coils. For the reason, as shown in FIG. 26, a decoupling circuit 114E is provided between the two loop coils having such a relation. In addition, although the decoupling circuit 114E is disposed only between the loop coil 107B of the coil set 114A and the loop coil 107A of the coil set 114B in FIG. 26, a decoupling circuit may be disposed between other corresponding loop coils.

The decoupling circuit 114E may have the same construction as that of the example shown in FIG. 8 or 13. The construction of the radio frequency coil assembly 115 is the same as that of the radio frequency coil assembly 107.

Figure 27:
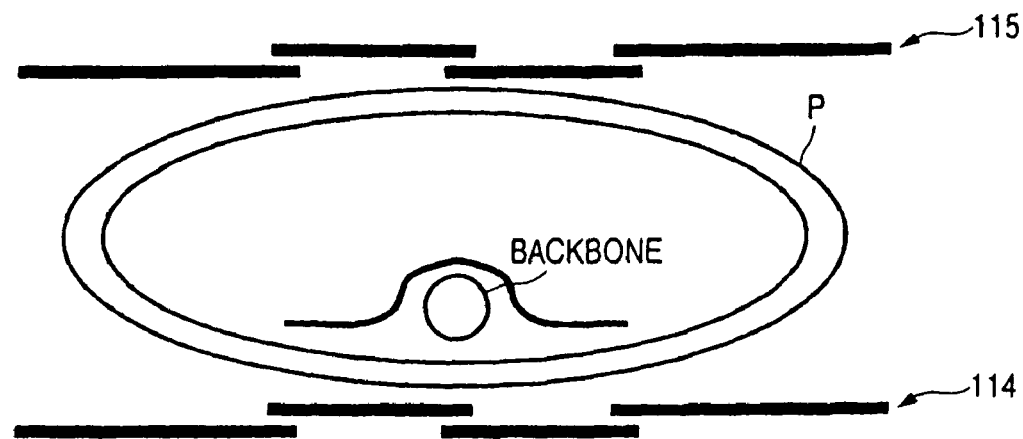
FIG. 27 is an axial cross sectional view showing a positional relation of a tested body P and the radio frequency coil assembly in a case where an image of backbone and abdomen of the tested body is picked up by using the MRI apparatus shown in FIG. 24.

FIG. 27 is an axial cross sectional view showing a positional relation of a tested body P and the radio frequency coil assemblies 114 and 115 in a case where an image of backbone and abdomen of the tested body is picked up by using the MRI apparatus shown in FIG. 24.

According to the third embodiment, the radio frequency coil assembly 114 is used, so that it is possible to pick up an image of the backbone with a good SN ratio in a wide range in the body axis direction. In addition, the radio frequency coil assembly 115 is used, so that it is possible to pick up an image of the abdomen with a good SN ratio.

In addition, according to the third embodiment, it is possible to implement a parallel image correspondence in the body axis direction and a direction perpendicular to the body axis direction.

The aforementioned embodiments may be modified into various manners as follows.

Although the sensitivity in the width direction increases as the width of the loop coil becomes narrow, the range of the sensitivity in the width direction becomes narrow. Therefore, although the area of the loop plane does not satisfy the aforementioned condition, the same effect as the second embodiment can be obtained. However, since an image can be picked up with a better SN ratio, the second embodiment is more preferable.

Figure 28:
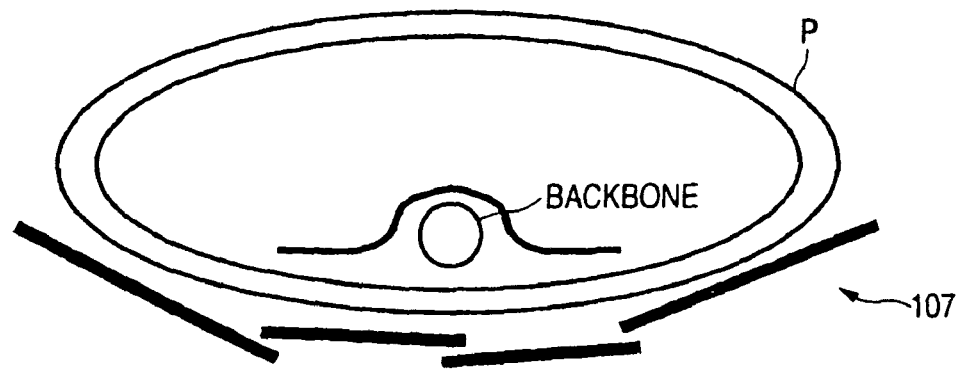
FIG. 28 is an axial cross sectional view showing an example where a radio frequency coil assembly is curved.
Figure 29:
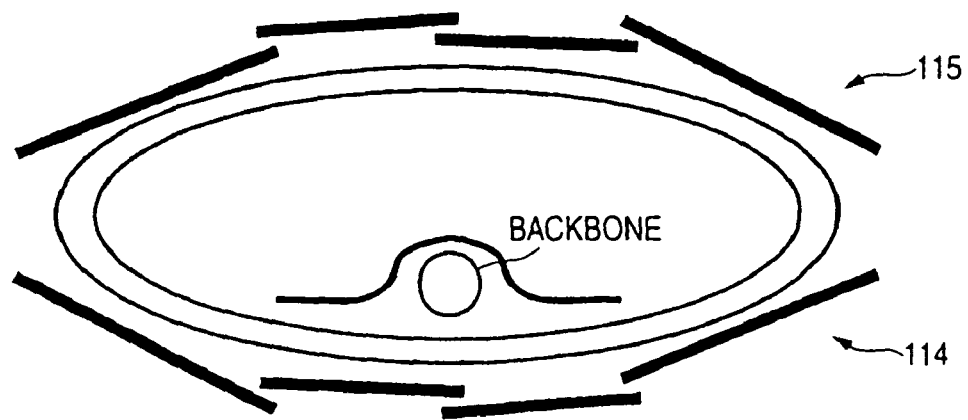
FIG. 29 is an axial cross sectional view showing an example where a radio frequency coil assembly is curved.
Figure 30:
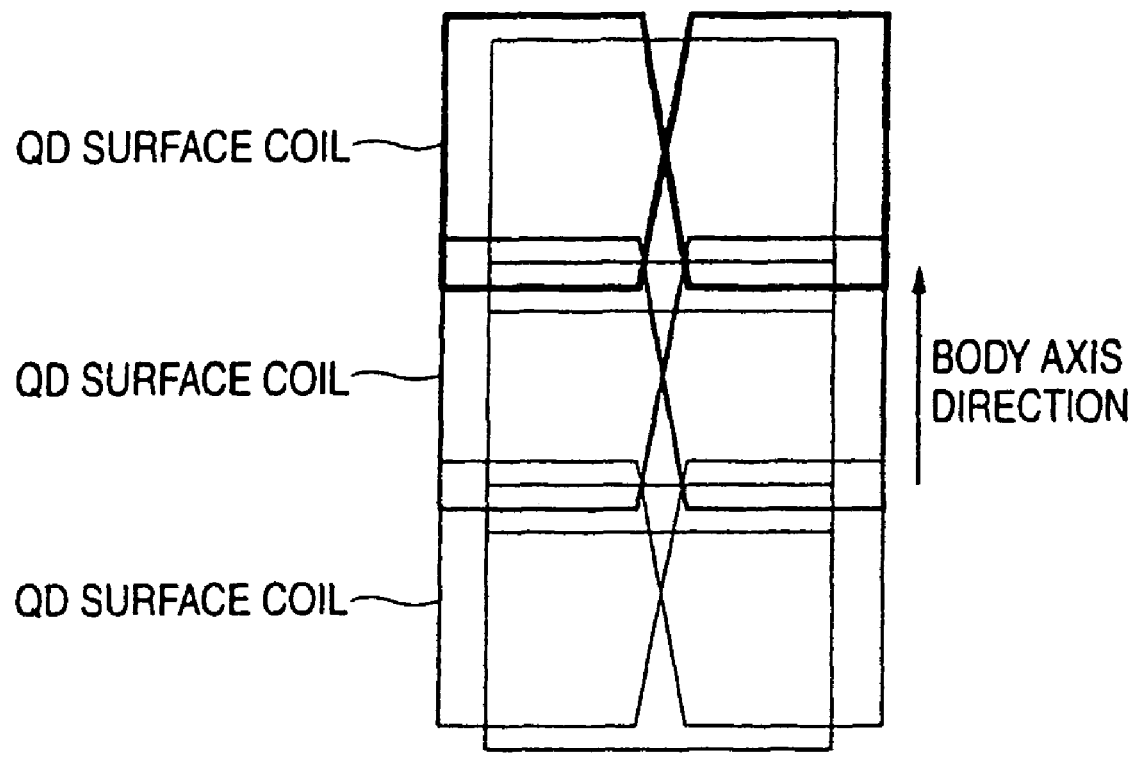
FIG. 30 is a view showing an example where an array coil is formed by arranging conventional QD surface coils in a body axis direction.
Figure 31:
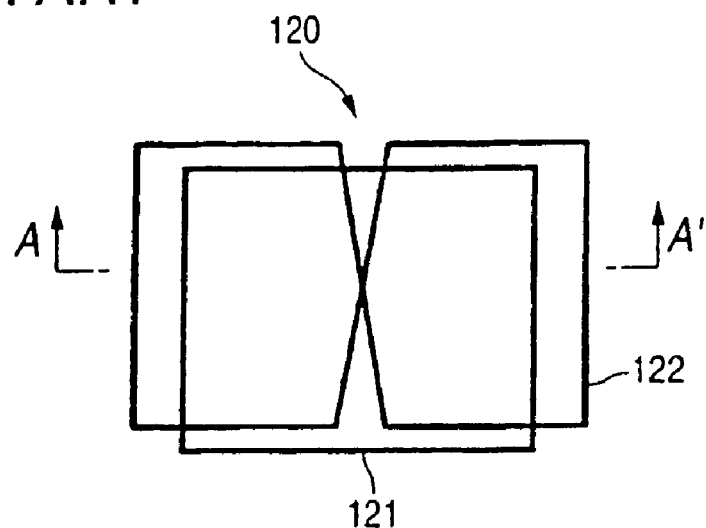
FIG. 31 is a view showing a conventional QD surface coil.
Figure 32:
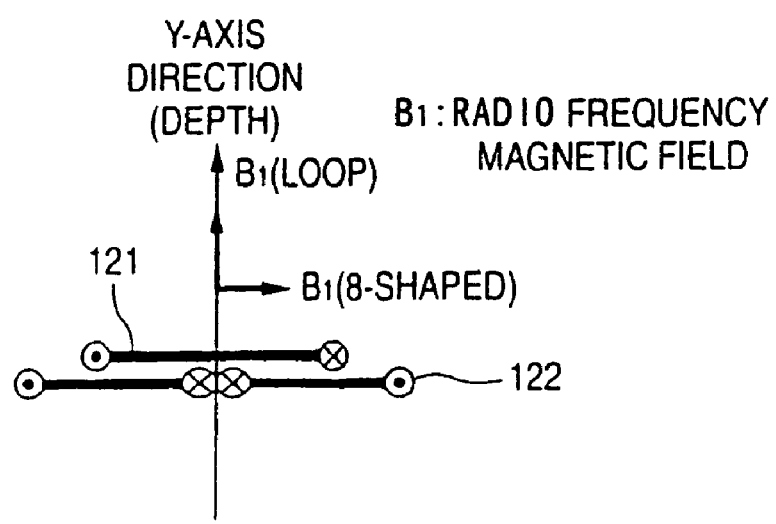
FIG. 32 is a view for explaining a radio frequency magnetic field generated by a conventional QD surface coil.
Figure 33:
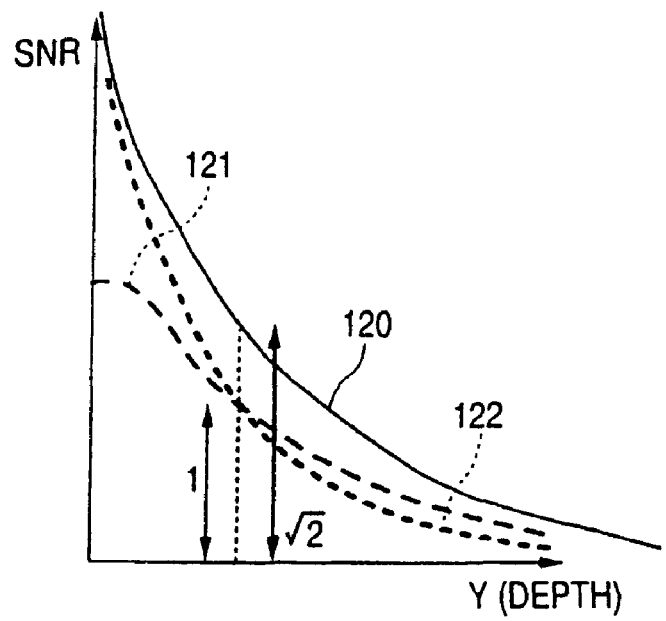
FIG. 33 is a view for explaining an SNR of a conventional QD surface coil.
Figure 34:
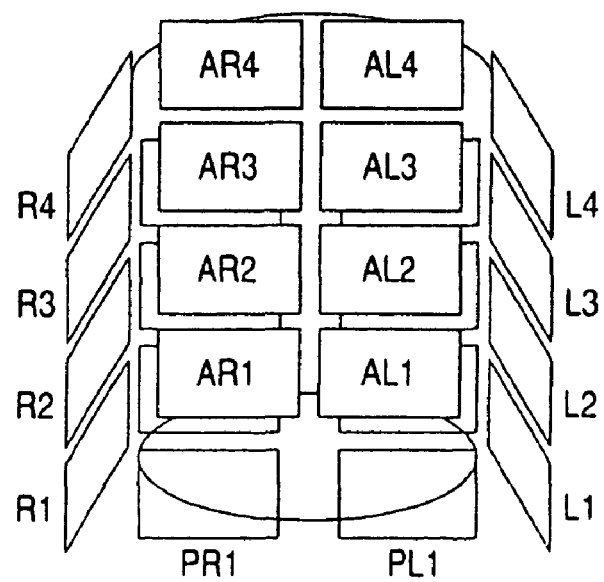
FIG. 34 is a view showing an example of an arrangement of conventional surface coils which are arranged to surround abdomen of a tested person.
Figure 35:
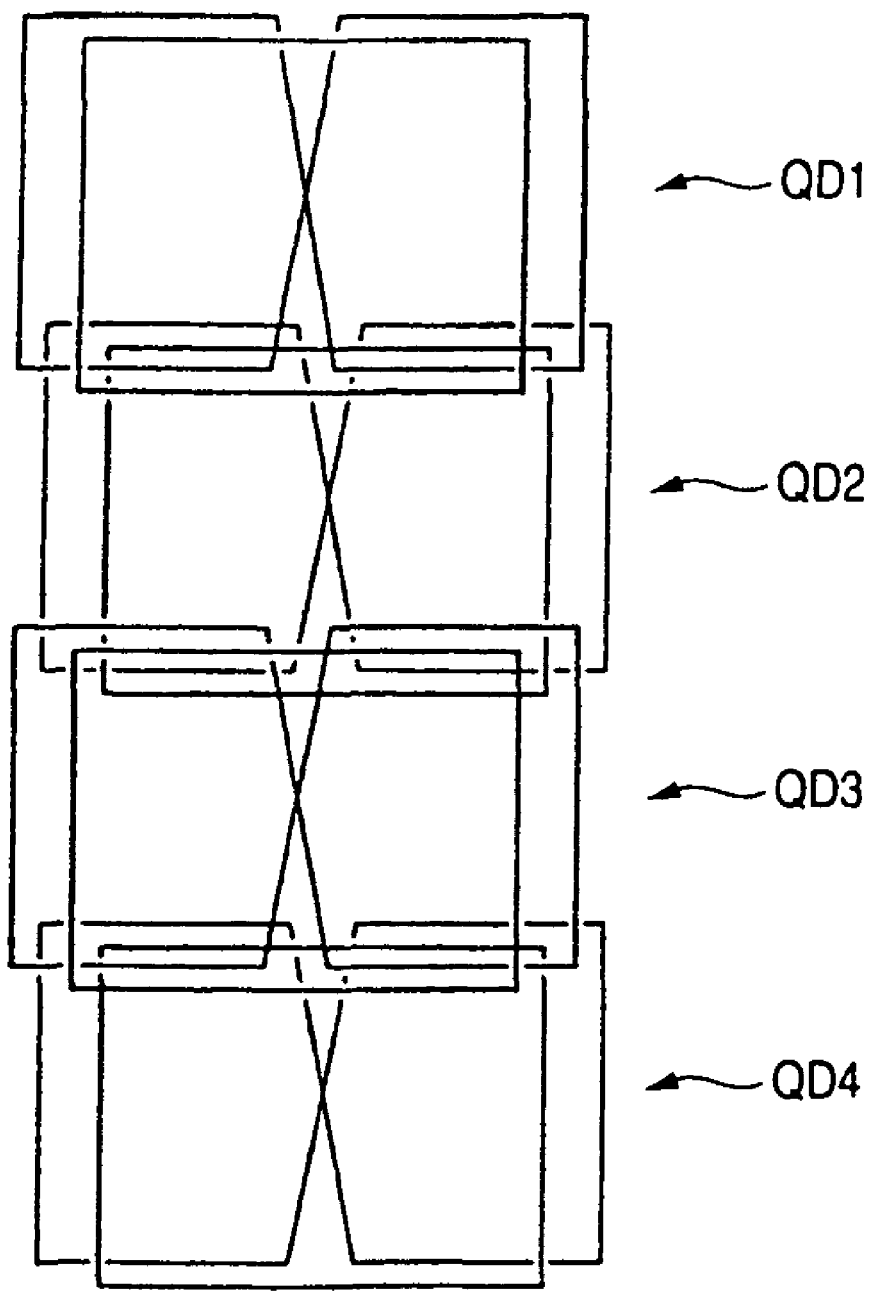
FIG. 35 is a view showing a construction of conventional QD surface coils.

As shown in FIGS. 28 and 29, the radio frequency coil assemblies 107, 114, and 115 may be curved, and in this state, the loop coils may be arranged. By doing so, as shown in FIGS. 28 and 29, the radio frequency coil assemblies 107, 114, and 115 may be disposed along the tested body P, so that the loop coils can be disposed to more closely approach the tested body P.

The output signals of the loop coils 107A, 107B, 107C, and 107D may be transmitted to the receiving unit 108. In addition, in receiving unit 108, the in-phase, out-of-phase, and QD combining processes may be performed as needed. Alternatively, the output signals are individually transmitted to the computer 110, and the reconstructing processes are independently performed based on the output signals. Next, a root mean square of the obtained four images is taken, so that one image may be obtained.

Instead of overlapping the loop coils 107A, 107B, 107C, and 107D, as shown in FIG. 8 or 13, the decoupling may be implemented by using a decoupling circuit.

In a case where a plurality of coils sets are provided to the radio frequency coil assembly 114, the number of the coil sets may be an arbitrary number.

The circuit shown in FIG. 22 may be employed by a radio frequency coil assembly having four equivalent loop coils.

Five or more loop coils may be provided.

Even in a case where the radio frequency coil assembly is constructed with two or three loop coils, if the widths and area of the one of the adjacent loop coils in the array direction thereof are smaller than those of the other, the same effect as the aforementioned embodiments can be obtained.

The invention is not limited to the above-described embodiments, but detailed components of the invention may be modified in various manners without departing from the scope of the invention. In addition, various aspects of the invention can be implemented by suitably combining a plurality of the components disclosed in the embodiments. For example, some of the components may be omitted form the entire components described in the embodiments. In addition, components of different embodiments may be suitably combined thereto.

What is claimed is:

1. A radio frequency coil assembly comprising:
    at least four loop coils including two inner loop coils disposed between two outer loop coils;
    wherein at least one of said coils has a shape different from another one of said coils to increase local sensitivity;
    a first combining unit which performs an in-phase combining process on output signals of the two inner loop coils;
    a second combining unit which performs an out-of-phase combining process on output signals of the two outer loop coils; and
    a phase-shifting and combining unit which performs (a) a 90-degree-phase shifting process on one of the output signals of the first and second combining unit, and (b) a combining process on output signals of the 90-degree shifting process and output signals of the other one of the first and second combining units.

2. The radio frequency coil assembly according to claim 1 wherein:
    each center axis of said loop coils with regard to a direction orthogonal to an arranging direction is arranged linearly as viewed from a direction crossing loop faces of said loop coils.

* * * * *